(12) United States Patent
Sun et al.

(10) Patent No.: US 12,556,090 B2
(45) Date of Patent: Feb. 17, 2026

(54) WIDE BAND GAP (WBG) DEVICES BASED THREE-LEVEL NEUTRAL POINT CLAMPED (NPC) POWER MODULE DESIGNS

(71) Applicants: VOLKSWAGEN AKTIENGESELLSCHAFT, Wolfsburg (DE); UNIVERSITY OF TENNESSEE RESEARCH FOUNDATION, Knoxville, TN (US)

(72) Inventors: Yue Sun, Knoxville, TN (US); Hua Bai, Knoxville, TN (US); Rüdiger Kusch, Braunschweig (DE); Daniel Costinett, Knoxville, TN (US)

(73) Assignees: VOLKSWAGEN AKTIENGESELLSCHAFT, Wolfsburg (DE); UNIVERSITY OF TENNESSEE RESEARCH FOUNDATION, Knoxville, TN (US)

( * ) Notice: Subject to any disclaimer, the term of this patent is extended or adjusted under 35 U.S.C. 154(b) by 224 days.

(21) Appl. No.: 18/391,057

(22) Filed: Dec. 20, 2023

(65) Prior Publication Data

US 2025/0030340 A1    Jan. 23, 2025

Related U.S. Application Data

(60) Provisional application No. 63/527,482, filed on Jul. 18, 2023.

(51) Int. Cl.
*H02M 3/158*   (2006.01)
*H02M 3/00*    (2006.01)

(52) U.S. Cl.
CPC .............. *H02M 3/158* (2013.01); *H02M 3/00* (2013.01)

(58) Field of Classification Search
CPC .......... H01L 23/5385; H01L 25/071; H01L 25/162; H02M 3/00; H02M 3/158; H02M 7/003; H02M 7/487
See application file for complete search history.

(56) References Cited

U.S. PATENT DOCUMENTS

2022/0330415 A1* 10/2022 Qiao ................. H02M 1/327
2023/0116118 A1*  4/2023 Schuderer .......... H01L 25/072
                                                257/774

(Continued)

OTHER PUBLICATIONS

Bilgin et al., "Making the Case for Electrified Transportation", IEEE Transactions on Transportation Electrification, vol. 1, No. 1, pp. 4-17, 2015.

(Continued)

*Primary Examiner* — Nathan Milakovich
(74) *Attorney, Agent, or Firm* — Shield Intellectual Property PC; Zhichong Gu

(57) ABSTRACT

A power module comprises: an upper arm structure that includes a first semiconductor switch, a second semiconductor switch and a first diode; a lower arm structure that includes a third semiconductor switch, a fourth semiconductor switch and a second diode; a first gate driving board, attached with the upper arm, wherein the first gate driving board includes a first gate driver connected to a first gate of the first semiconductor switch and a second gate driver connected to a second gate of the second semiconductor switch; a second gate driving board, attached with the lower arm, wherein the second gate driving board includes a third gate driver connected to a third gate of the third semiconductor switch and a fourth gate driver connected to a fourth gate of the fourth semiconductor switch; etc.

20 Claims, 43 Drawing Sheets

(56) References Cited

U.S. PATENT DOCUMENTS

2023/0133950 A1* 5/2023 Fu .................. H02M 1/0054
2025/0030353 A1* 1/2025 Sun .................. H05K 7/1432

OTHER PUBLICATIONS

Cheng et al., "Thermal and Reliability Characterization of an Epoxy Resin-Based Double-Side Cooled Power Module", Journal of Microelectronics and Electronic Packaging, vol. 18, No. 3, pp. 123-136, 2021.

Dai et al., "Comparative Thermal and Structural Characterization of Sintered Nano-Silver and High-Lead Solder Die Attachments During Power Cycling", IEEE Transactions on Device and Materials Reliability, vol. 18, No. 2, pp. 256-265, 2018.

Keshmiri et al., "Current Status and Future Trends of GaN HEMTs In Electrified Transportation", IEEE Access, vol. 8, pp. 70553-70571, 2020.

Lu et al., "A GaN/Si Hybrid T-Type Three-Level Configuration for Electric Vehicle Traction Inverter", 2018 IEEE 6th Workshop on Wide Bandgap Power Devices and Applications (WiPDA), Oct. 31-Nov. 2, 2018, pp. 77-81.

US Drive Electrical and Electronics Technical Team Roadmap, https://www.energy.gov/eere/vehicles/articles/us-drive-electrical-and-electronics-technical-team-roadmap, Oct. 2017.

Wolfspeed, "E-Series Automotive-Qualified Silicon Carbide MOSFETs: 1200 V, 21 mΩ, 104 A, TO-247-4 package, Gen 3 Discrete SiC MOSFET".

Wolfspeed, "E-Series Automotive-Qualified Silicon Carbide MOSFETs: 1200 V, 21 mΩ, 104 A, TO-247-4 package, Gen 3 Discrete SiC MOSFET", Year: 2022.

* cited by examiner

WIDE BAND GAP (WBG) DEVICES BASED THREE-LEVEL NEUTRAL POINT CLAMPED (NPC) POWER MODULE DESIGNS

CROSS REFERENCE TO RELATED APPLICATIONS

This application is claims priority to U.S. Provisional Applications 63/527,482, filed 18 Jul. 2023, the contents of which are incorporated herein by reference in their entirety.

This application is related to U.S. patent application Ser. No. 18/391,031, titled "WIDE BAND GAP (WBG) DEVICES BASED THREE-LEVEL ACTIVE NEUTRAL POINT CLAMPED (ANPC) POWER MODULE DESIGNS," by Yue Sun, Hua Bai, Rüdiger Kusch, Daniel Costinett, filed on equal day, the contents of which are hereby incorporated herein by reference for all purposes as if fully set forth herein.

TECHNICAL FIELD

Embodiments relate generally to power modules, and, more specifically, to WBG power modules/devices.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Electric power components, including but not limited to integrated circuits for power applications in connection with electric vehicle (EV) systems or non-vehicle systems, are susceptible to generate excessive heat and high temperature during operation.

In addition, existing power modules may be based on traditional silicon devices and suffer from high power loop inductance and high gate loop inductance. Existing structures and layouts may not be suitable or optimal for WBG based power modules/devices such as those used in electric vehicle propulsion operations.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

Figure 1A:
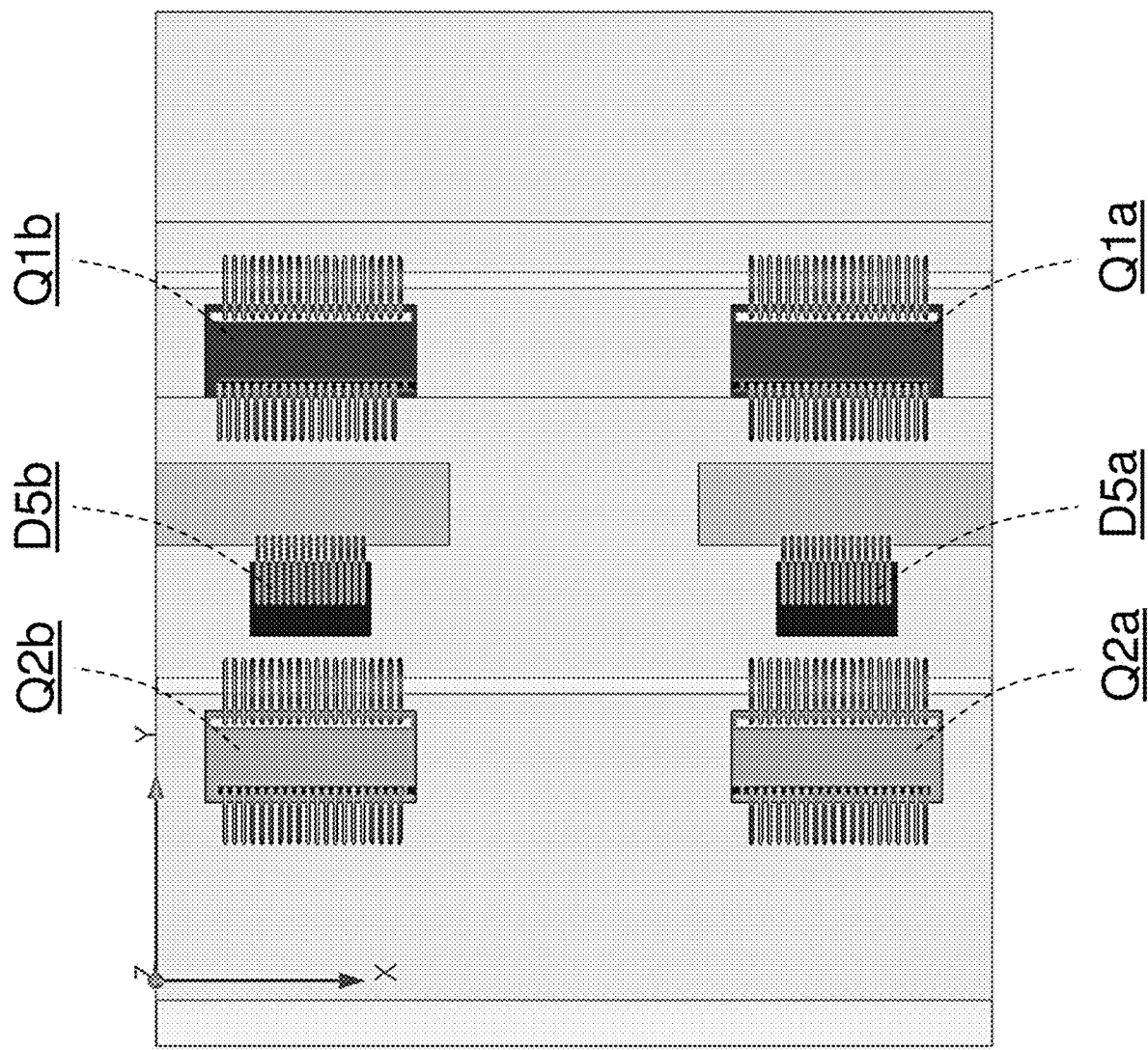
FIG. 1A through FIG. 1D illustrate example mother substrates used to assemble a power module.

In the following description, for the purposes of explanation, numerous specific details are set forth in order to provide a thorough understanding of the present disclosure. It will be apparent, however, that the present disclosure may be practiced without these specific details. In other instances, well-known structures and devices are shown in block diagram form in order to avoid unnecessarily obscuring the present disclosure.

Embodiments are described herein according to the following outline:

1.0. General Overview
2.0. NPC Design
   2.1. NPC Power Module Assembly
   2.2. Minimizing Power Loop Inductances
   2.3. Gate Driving Board Placement
   2.4. Distributed terminal Designs
   2.5. Decoupling Capacitors
   2.6. Cooling Plate(s)
   2.7. Mechanical Support and Interconnections
3.0 ANPC Design
   3.1. ANPC Power Module Assembly
   3.2. Minimizing Power Loop Inductances
   3.3. Gate Driving Board Placement
   3.4. Distributed terminal Designs
   3.5. Decoupling Capacitors
   3.6. Cooling Plate(s)
   3.7. Mechanical Support and Interconnections
   3.8. Stacking Substrates Design
4.0. Extensions and Alternatives

1.0. General Overview

For next generation EVs, the power ratings of traction motors are increasing from tens of kW to hundreds of kW and the voltages of battery packs are also increasing from 400V to 800V, which call for EV traction inverters with a rated power of 100 kW or higher at a DC bus voltage of 800V. Meanwhile, the targeted power density of the EV traction inverter listed by U.S. DRIVE (Driving Research and Innovation for Vehicle efficiency and Energy sustainability) is increasing from 13.4 kW/L by 2020 to 33 kW/L by 2025, making GaN HEMT (high-electron-mobility transistor) a promising candidate due to its fast switching speed and low switching loss that can result in smaller heatsinks and footprints, and smaller passives by switching at higher switching frequency. In some operational scenarios, high-current GaN devices are rated at ~650V, making them unfit to undertake 800 Vdc directly using a two-level (2L) topology. Under techniques as described herein, in these operational scenarios, power modules can be implemented with a three-level (3L) topology instead.

However, high voltage slew rate dv/dt and high current slew rate di/dt resulting from fast switching speed can make GaN HEMTs very sensitive to loop parasitic inductance. Packaging designs under techniques as described herein can be applied to reduce parasitic loop inductance, which is essential to fully exploit their benefits resulting from fast switching speed.

Approaches, techniques, and mechanisms are disclosed for assembling and/or packaging electric power components. A power module comprises: an upper arm structure that includes a first semiconductor switch, a second semiconductor switch and a first diode; a lower arm structure that includes a third semiconductor switch, a fourth semiconductor switch and a second diode; a first gate driving board, attached with the upper arm, wherein the first gate driving board includes a first gate driver connected to a first gate of the first semiconductor switch and a second gate driver connected to a second gate of the second semiconductor switch; a second gate driving board, attached with the lower arm, wherein the second gate driving board includes a third gate driver connected to a third gate of the third semiconductor switch and a fourth gate driver connected to a fourth gate of the fourth semiconductor switch.

Approaches, techniques, and mechanisms are disclosed for assembling and/or packaging electric power components. A power module comprises: an upper arm structure that includes a first semiconductor switch, a second semiconductor switch and a fifth semiconductor switch; a lower arm structure that includes a third semiconductor switch, a fourth semiconductor switch and a sixth semiconductor switch; a first gate driving board, attached with the upper arm, wherein the first gate driving board includes a first gate driver connected to a first gate of the first semiconductor switch, a second gate driver connected to a second gate of the second semiconductor switch, and a third gate driver connected to a fifth gate of the fifth semiconductor switch; a second gate driving board, attached with the lower arm, wherein the second gate driving board includes a third gate driver connected to a third gate of the third semiconductor switch, a fourth gate driver connected to a fourth gate of the fourth semiconductor switch, and a sixth gate driver connected to a sixth gate of the sixth semiconductor switch.

2.0. NPC Design

Embodiments are directed to relatively low power-loop inductance, relatively low gate-drive-loop inductance, relatively low semiconductor junction-to-coolant thermal resistance and relatively low-profile power modules/devices, as compared with existing power modules/devices. A power module as described herein may implement a three-level neutral point clamped (3L NPC) topology or design with ultra-fast wide-band-gap (WBG) semiconductor such as gallium nitride (GaN) (e.g., vertical GaN, lateral GaN, etc.).

Example advantages and/or benefits provided by some or all the embodiments as described herein include, but are not necessarily limited to only: relatively low power loop inductance; integrated gate driving circuits (controlling the operations and/or operational states of semiconductor switches such as GaN-based switches); relatively low gate loop inductance; symmetrical layout with scalable (e.g., with a total number of semiconductor switches such as GaN-based switches, etc.) design; distributed terminals for balanced current sharing among (e.g., spatially, etc.) paralleled dies (containing/including semiconductor switches); decoupling capacitors on the power terminals; double-sided cooling; mechanically robust; support for Flex PCB (as well as non-Flex PCB) interconnection of gate driving circuits and/or semiconductor switches.

2.1. NPC Power Module Assembly

An example module/device assembly process flow for assembling an NPC power module may include, but is not necessarily limited to only, any, some or all of the following steps.

Figure 1B:
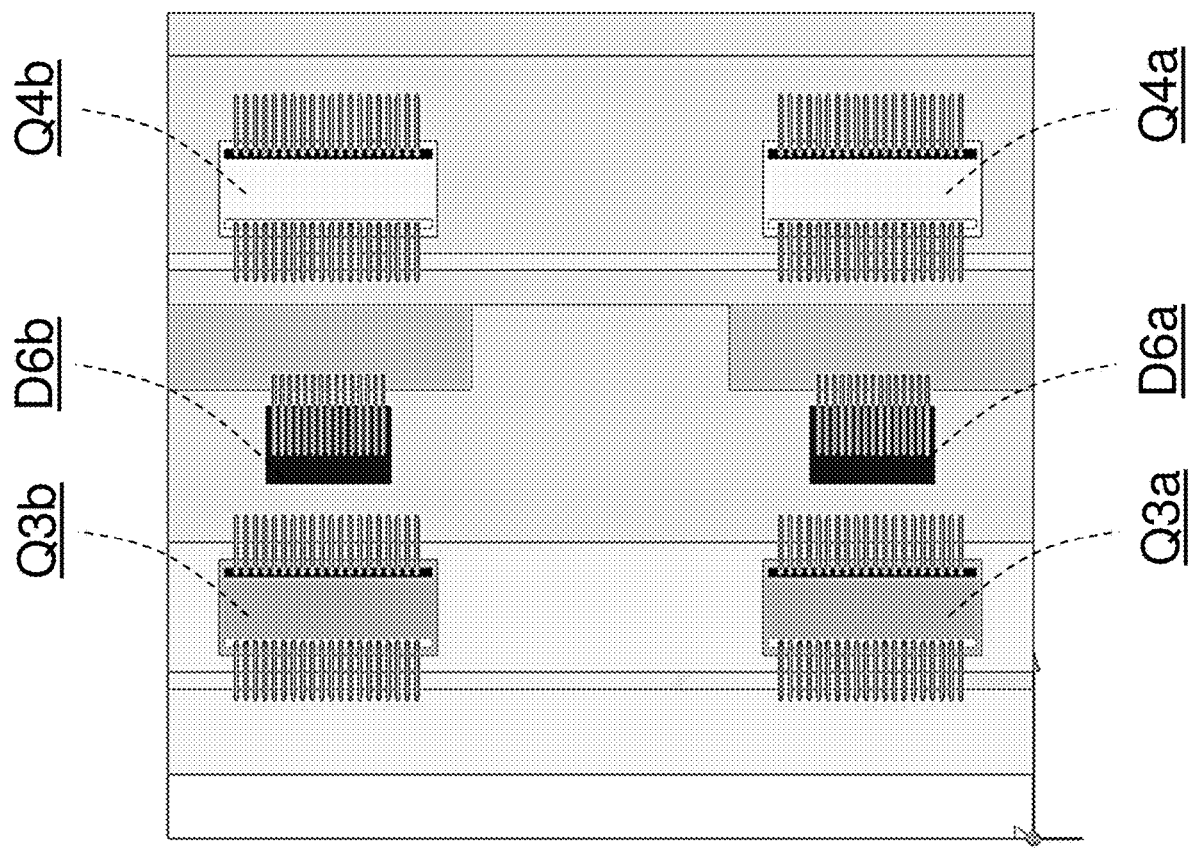

The module/device assembly process flow may include Step 1, in which (two) daughter substrates and semiconductor switches/diodes therewith are sintered to (two) mother substrates, respectively, as shown in FIG. 1A and FIG. 1B. The semiconductor switches/diodes may then be electrically interconnected through wire bonding. In a non-limiting example, GaN devices or switches used herein may be of a lateral type with active regions such as gate, drain and source being all at one side. Under techniques as described herein, these GaN devices or switches can be assembled or packaged with vertical arrangement of peripheral circuits such as bus bars. Wire bonds may be used to bond all these active regions to the DBC first. The DBC can be connected to other bus bars in any manners convenient for the assembly. As illustrated in FIG. 2A through FIG. 2D, a switch gate as described herein may be at the same side of source, for example both facing upwards. Wires may be bonded directly from the gate and source to the gate driver boards. Additionally, optionally or alternatively, some or all techniques as described herein can be implemented with other switch types such as vertical devices/switches, SiC/Si devices/switches, which may have both gate and source facing up.

For the purpose of illustration only, FIG. 1A depicts a first mother substrate to which one or more first daughter substrates—mounted or disposed with first dies for Q2*a*, Q2*b*, D5*a*, D5*b*, Q1*a* and Q1*b*—are sintered. Similarly, FIG. 1B depicts a second mother substrate to which one or more second daughter substrates—mounted or disposed with second dies for Q3*a*, Q3*b*, D6*a*, D6*b*, Q4*a* and Q4*b*—are sintered.

In some operational scenarios, each semiconductor switch/diode as described herein may be formed by one or more separate dies electrically connected in parallel. For example, as illustrated in FIG. 1A and FIG. 1B, the dies Q1*a* and Q1*b* may be electrically connected in parallel and form a semiconductor switch Q1. The dies Q2*a* and Q2*b* may be electrically connected in parallel and form a semiconductor switch Q2. The dies Q3*a* and Q3*b* may be electrically connected in parallel and form a semiconductor switch Q3. The dies Q4*a* and Q4*b* may be electrically connected in parallel and form a semiconductor switch Q4. The dies D5*a* and D5*b* may be electrically connected in parallel and form a diode D5. The dies D6*a* and D6*b* may be electrically connected in parallel and form a diode D6.

Figure 2A:
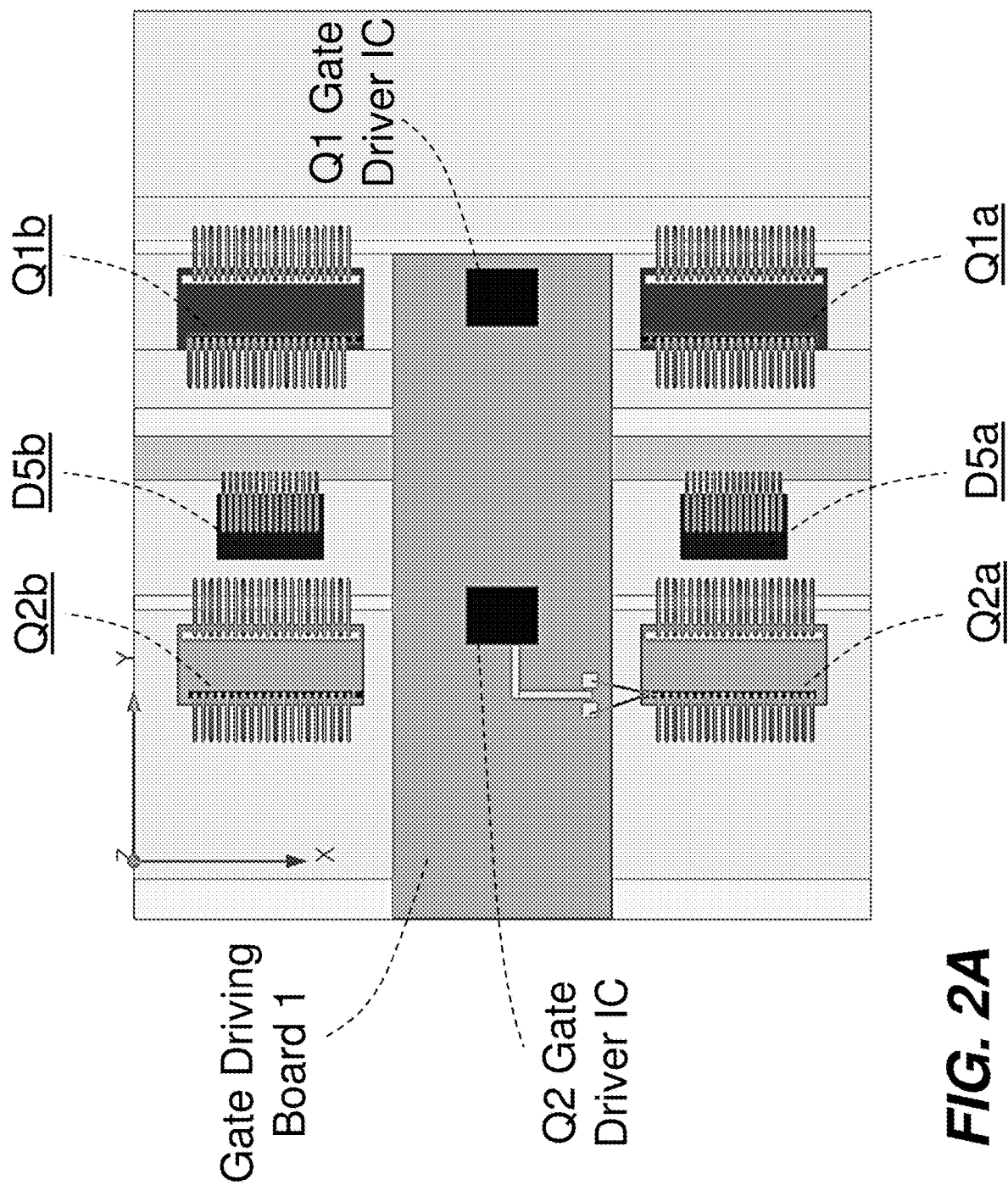
FIG. 2A through FIG. 2H illustrate example mother substrates with gate driving boards.
Figure 2B:
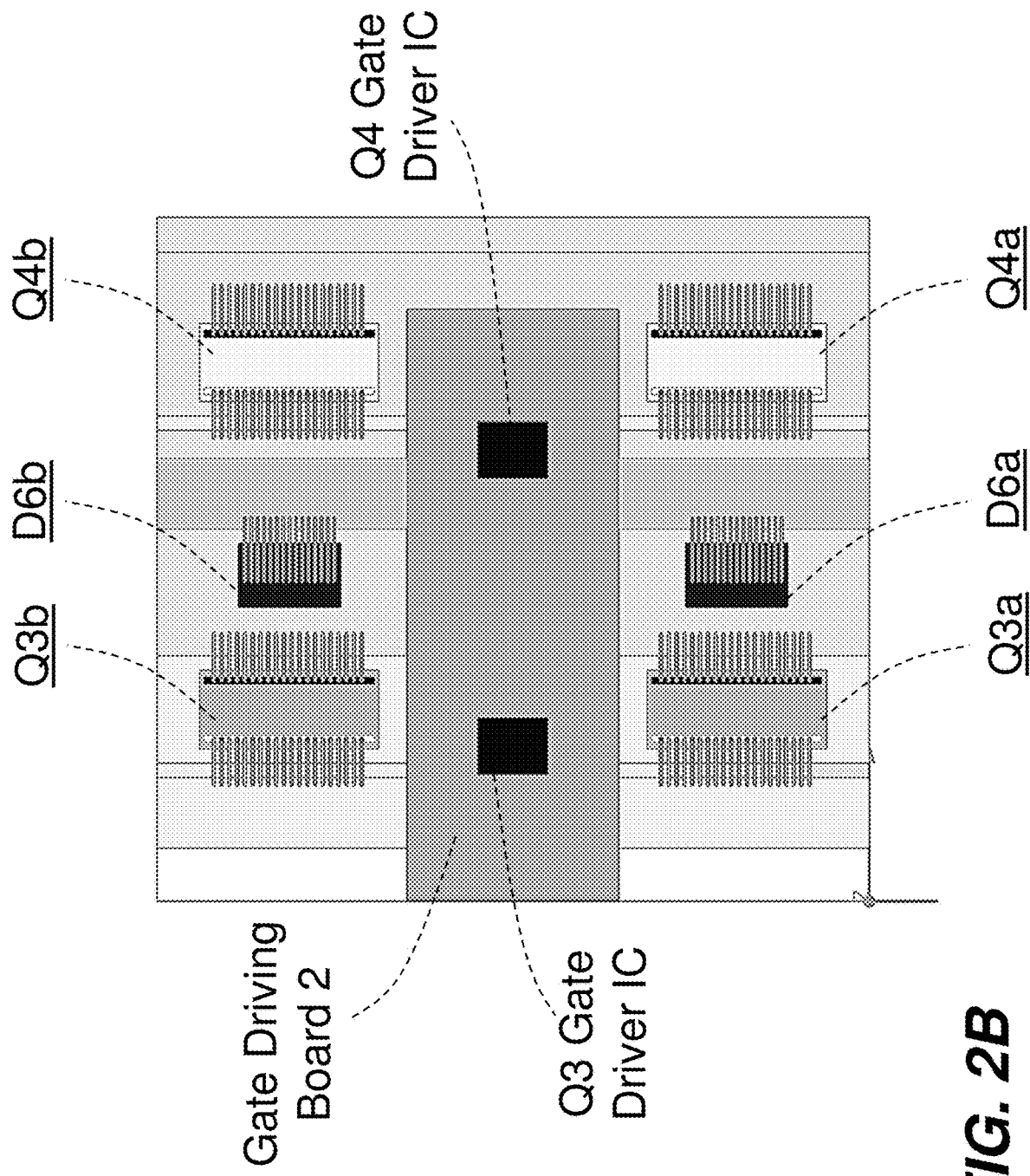

The module/device assembly process flow for assembling an NPC power module may include Step 2, in which (two) gate drive boards are assembled or attached to the (two) mother substrates, respectively, as shown in FIG. 2A and FIG. 2B. The gate drive boards may include gate driver ICs for some or all of the semiconductor switches. Gate pads of some or all of the semiconductor switches may be electrically connected with the gate driver ICs on the gate drive boards.

As illustrated in FIG. 2A, a first gate drive board is assembled or attached to the first mother substrate of FIG. 1A. The first gate drive board includes a first gate driver IC for the semiconductor switch Q2 and a second gate driver IC for the semiconductor switch Q1. Gate pads of the semiconductor switch Q2 may be electrically connected with the first gate driver IC, whereas gate pads of the semiconductor switch Q1 may be electrically connected with the second gate driver IC.

Also as illustrated in FIG. 2B, a second gate drive board is assembled or attached to the second mother substrate of FIG. 1B. The second gate drive board includes a third gate driver IC for the semiconductor switch Q3 and a fourth gate driver IC for the semiconductor switch Q4. Gate pads of the semiconductor switch Q3 may be electrically connected with the third gate driver IC, whereas gate pads of the semiconductor switch Q4 may be electrically connected with the fourth gate driver IC.

Figure 3A:
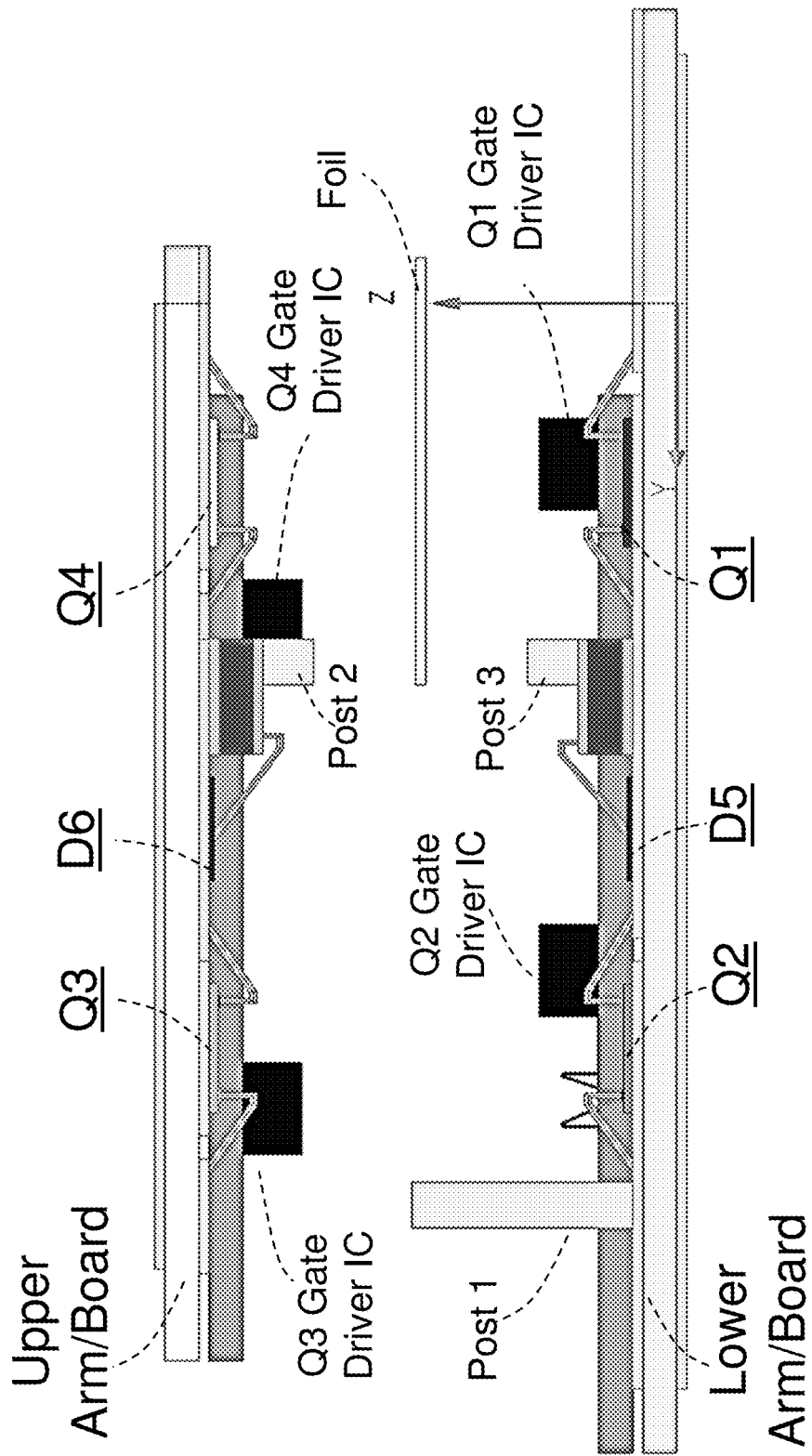
FIG. 3A and FIG. 3B illustrate example mother substrates as upper and lower arms of a power module.

The module/device assembly process flow for assembling an NPC power module may include Step 3, in which posts such as copper or conductive posts, a (e.g., single, etc.) neutral terminal, and so are mounted, attached, or otherwise disposed with one or both of the two mother substrates. As illustrated in FIG. 3A, one of the posts, namely, post 2 is mounted, attached or otherwise disposed with the second mother substrate of FIG. 2B, whereas posts 1 and 3 are mounted, attached or otherwise disposed with the first mother substrate of FIG. 2A. The first and second mother substrates of FIG. 1A and FIG. 2B with the posts are then assembled with foil such as copper or conductive foil, etc., to form an electrically and/or mechanically interconnected module/device.

More specifically, the second mother substrate of FIG. 2B serves as an upper arm or board along a spatial direction represented by Z, whereas the first substrate of FIG. 2A serves as a lower arm or board along the same spatial direction (Z). The spatial direction (Z) may form a three-dimensional Cartesian coordinate system with two other spatial directions represented by X and Y (perpendicular to each other and Z), respectively. Both the first and second mother substrates may be (e.g., exactly, substantially, etc.) of a planar shape along the X and Y spatial directions as illustrated in FIG. 1A.

The electrically and/or mechanically interconnected module/device may be assembled by placing or moving the upper arm/board downward or toward the lower arm/board, (1) until post 1 disposed with the lower arm/board is in actual (e.g., physical, mechanical, electrical, etc.) contact with the upper arm/board and (2) until post 2 disposed with the upper arm/board is in actual (e.g., physical, mechanical, electrical, etc.) contact with the foil, post 3 disposed with the lower arm/board and any intervening physical (e.g., thermally and/or electrically conductive, thermally and/or electrically insulating, etc.) materials.

Figure 4A:
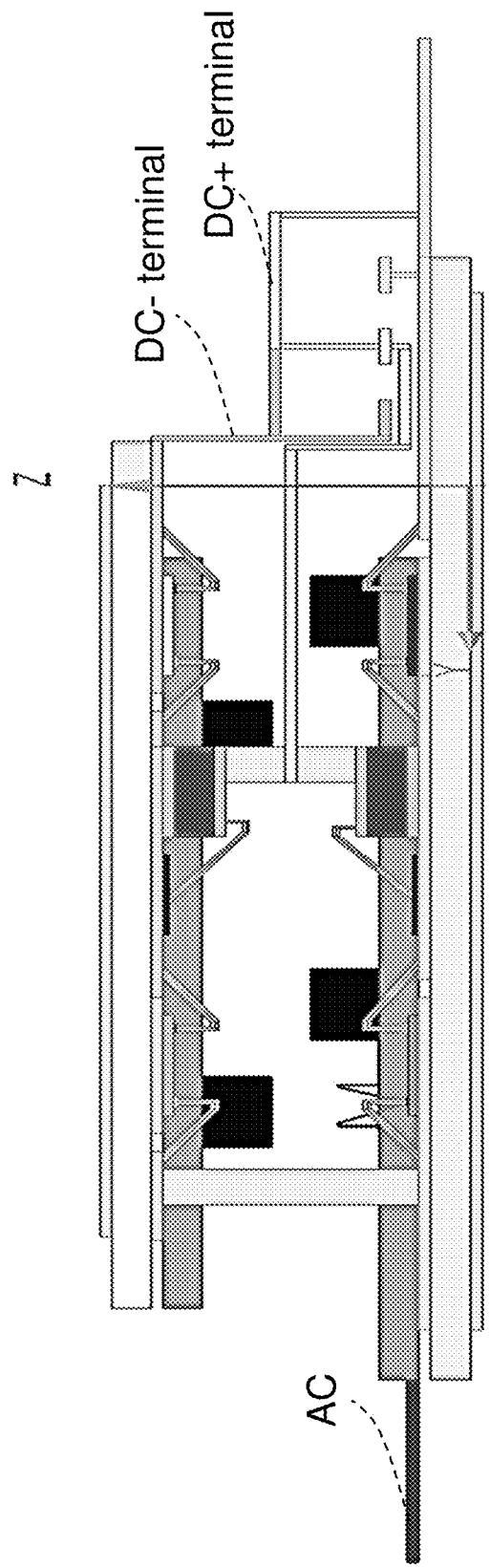
FIG. 4A and FIG. 4B illustrate example terminals of a power module.
Figure 5A:
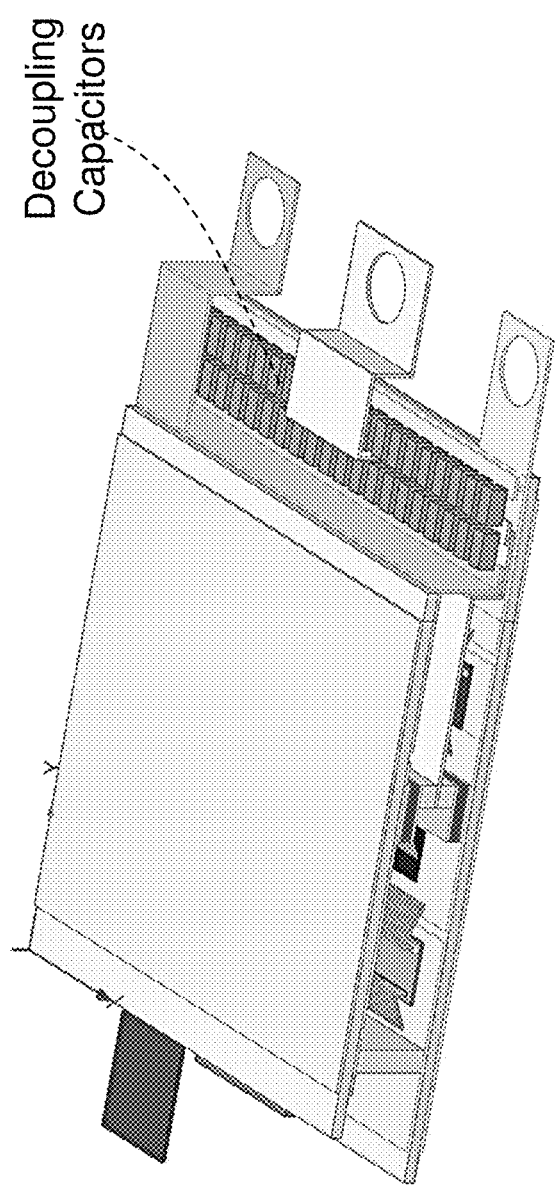
FIG. 5A and FIG. 5D illustrate example power modules with capacitors.

The module/device assembly process flow for assembling an NPC power module may include Step 4, in which other parts such as other terminals (e.g., DC+, DC−, neutral point or terminal, etc.) may be assembled into the module/device from Step 3 to form the module/device of FIG. 4A; and Step 5, in which decoupling capacitors may be assembled into the module/device from Step 4 to form the (e.g., final, functional, power switch, power inverter, to be attached with cooling plates on the upper and lower surfaces of the module, etc.) module/device of FIG. 5A.

2.2. Minimizing Power Loop Inductances

Figure 6A:
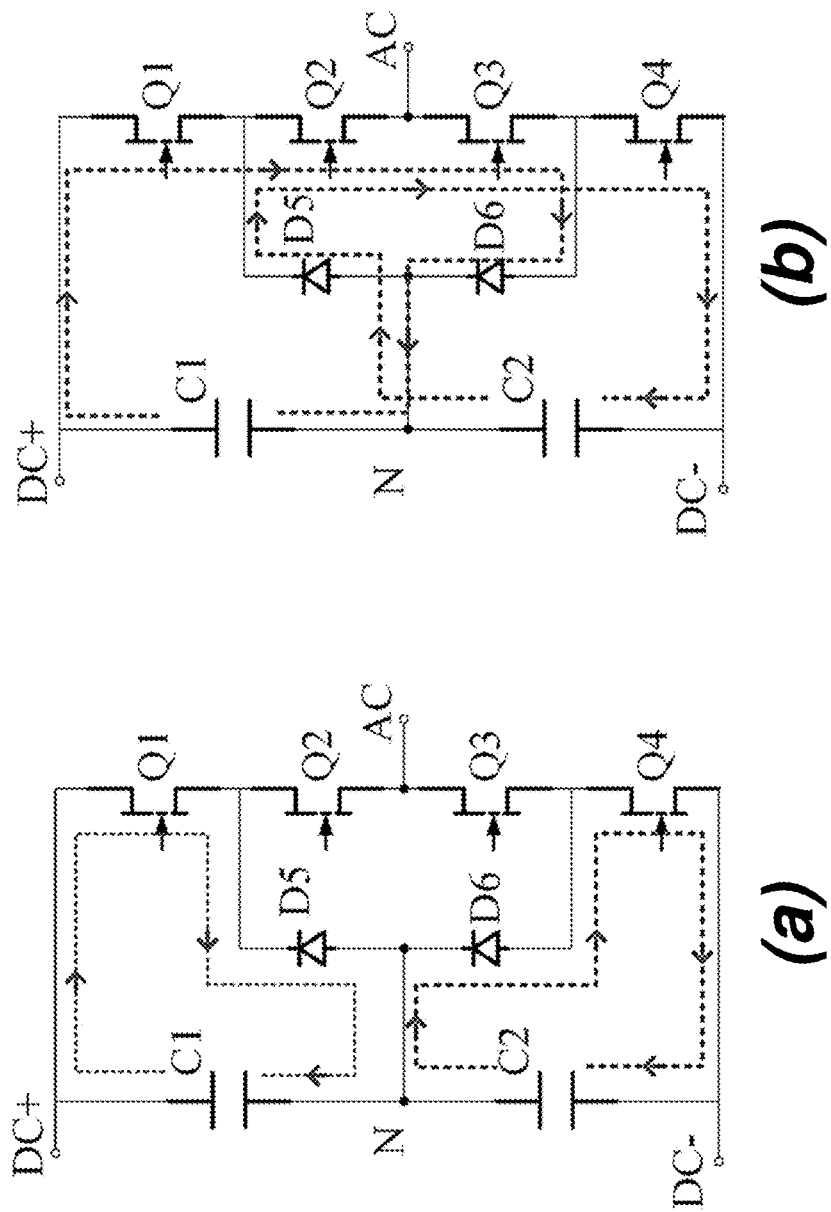
FIG. 6A, FIG. 6B, FIG. 7A and FIG. 7B illustrate example commutation loops when power module(s) are in operation.
Figure 7A:
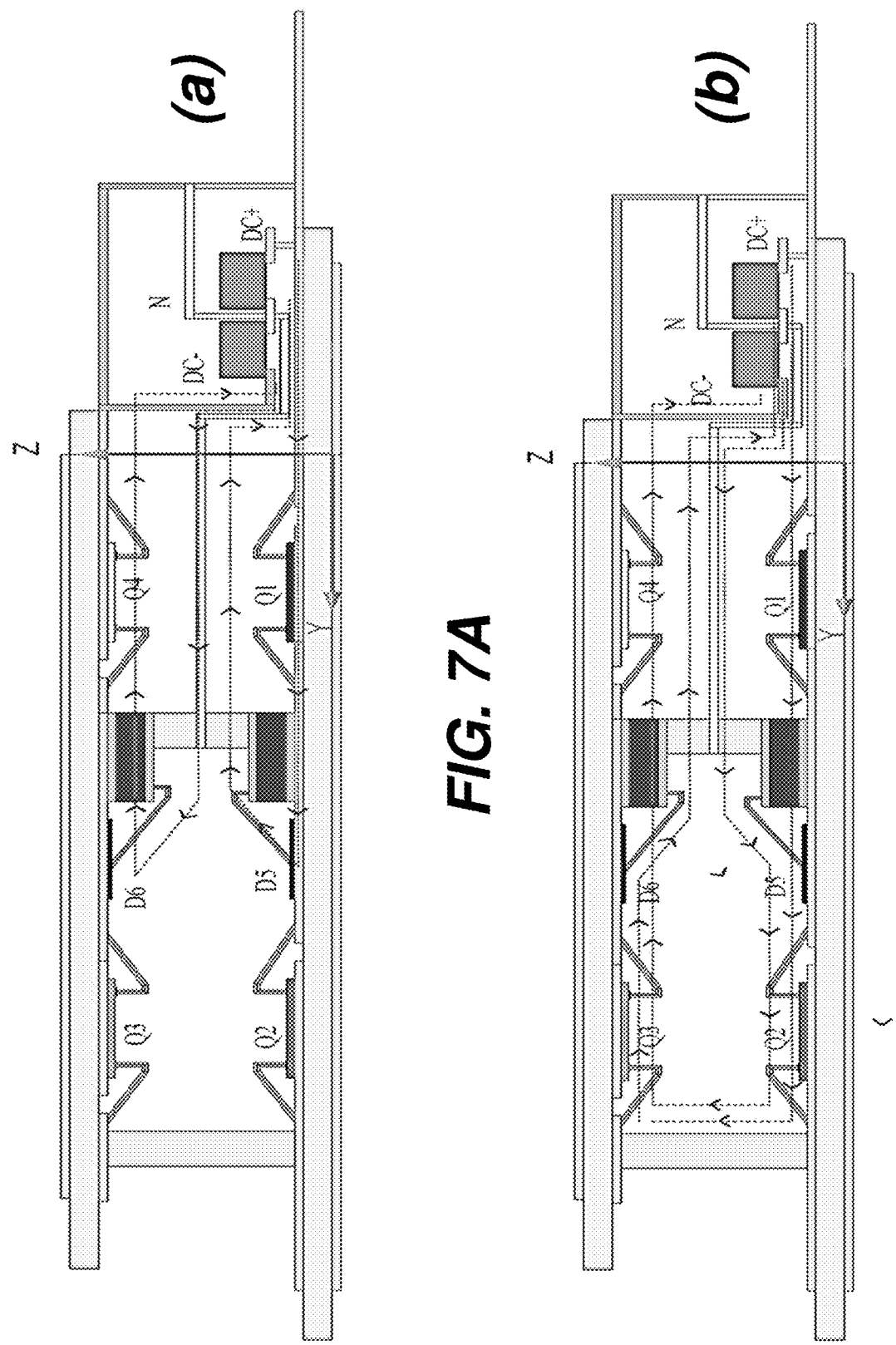

An NPC power module assembled under techniques as described herein produces relatively low power loop inductance in (e.g., realtime, actual, field, etc.) operation. FIG. 6A and FIG. 7A illustrate example short commutation loops and long commutation loops when the power module operates in first operational/switching states (corresponding to two first different quadrants in four quadrants) and second different operational/switching states (corresponding to two second different quadrants in four quadrants), respectively. Each of these commutation loops represents a specific DC electric current flow through a number of specific components such as specific semiconductor switches/diodes in the NPC power module. The specific DC electric current flow in the corresponding commutation loop can be effectuated by using gate driver ICs to set gates of the semiconductor switches to specific gate states.

More specifically, FIG. 6A (a)—along with FIG. 7A (a)—illustrates two short commutation loops (e.g., sharing or being clamped to the same neural terminal, etc.) formed when the power module operates in the first operational/switching states or quadrants.

FIG. 6A (b)—along with FIG. 7A (b)—illustrates two long commutation loops (e.g., sharing or being clamped to the same neural terminal, etc.) formed when the power module operates in the second operational/switching states or quadrants.

Flux cancelling is one of effective methods to reduce the loop inductance. By maximizing the negative mutual inductance, the total loop inductance is minimized. As illustrated in FIG. 6A and FIG. 7A, the forward current paths and the backward current paths of both the short and long commutation loops are fully overlapped, so that the magnetic flux can be canceled to the maximum extent. Additionally, optionally or alternatively, in operational scenarios in which wire-bonding connection is replaced by copper or conductive foil connection, the distance between the two mother substrates (e.g., DBCs, etc.) and the distance between the neutral terminal and mother substrates (DBCs in the present example) can be further shortened. Consequently, the loop inductances can be further reduced.

2.3. Gate Driving Board Placement

Gate driving electric currents flowing through the gate driver ICs integrated with (e.g., gate lines of, etc.) the semiconductor switches may be relatively small as compared with power loop electric currents flowing in the power loops illustrated in FIG. 6A and FIG. 7A. The gate driving electric currents may generate magnetic fluxes and hence generate (e.g., relatively low, etc.) gate driving loop inductances. In some operational scenarios, the gate driving loop inductances can be minimized by the shorting (conductive or copper) trace length(s) and/or by implementing flux cancellation by concurrent gate driving loops with opposite loop directions.

As illustrated in FIG. 2A and FIG. 2B, a symmetrical layout and scalable design may be used to arrange semiconductor switches and gate driving ICs. For example, two dies (e.g., Q1a and Q1b, etc.) may be used in parallel for each semiconductor switch (e.g., Q1, etc.). The gate driving board on which the gate driving ICs are mounted or attached may be placed in the middle of the mother substrates in the power module. Hence, both the power loops and gate driving loops can be made symmetrical. One of the prominent benefits under techniques as described herein is balanced current sharing among the parallel dies of each of the semiconductor switches while the power module is in operation.

The power module design as described herein is also scalable with two or more dies in parallel (or parallelized) for each semiconductor switch to increase the overall power rating or capacity of the power module. One or more sets of gate driving circuits or ICs can be used accordingly. One or more gate driving boards can also be at on one or both sides (e.g., upper and/or lower side(s) in the X-Y plane of each of the mother substrates, etc.) of the power module. In some operational scenarios, the symmetry of the gate driving loops may be lost or may not be maintained while the symmetry of the power loop can be maintained. In some operational scenarios, physical materials or substrate(s) (e.g., directly, etc.) underneath the gate driving board need not to be those of direct bonded copper (DBC), which may reduce or lower costs for DBC in the power module.

Figure 2C:
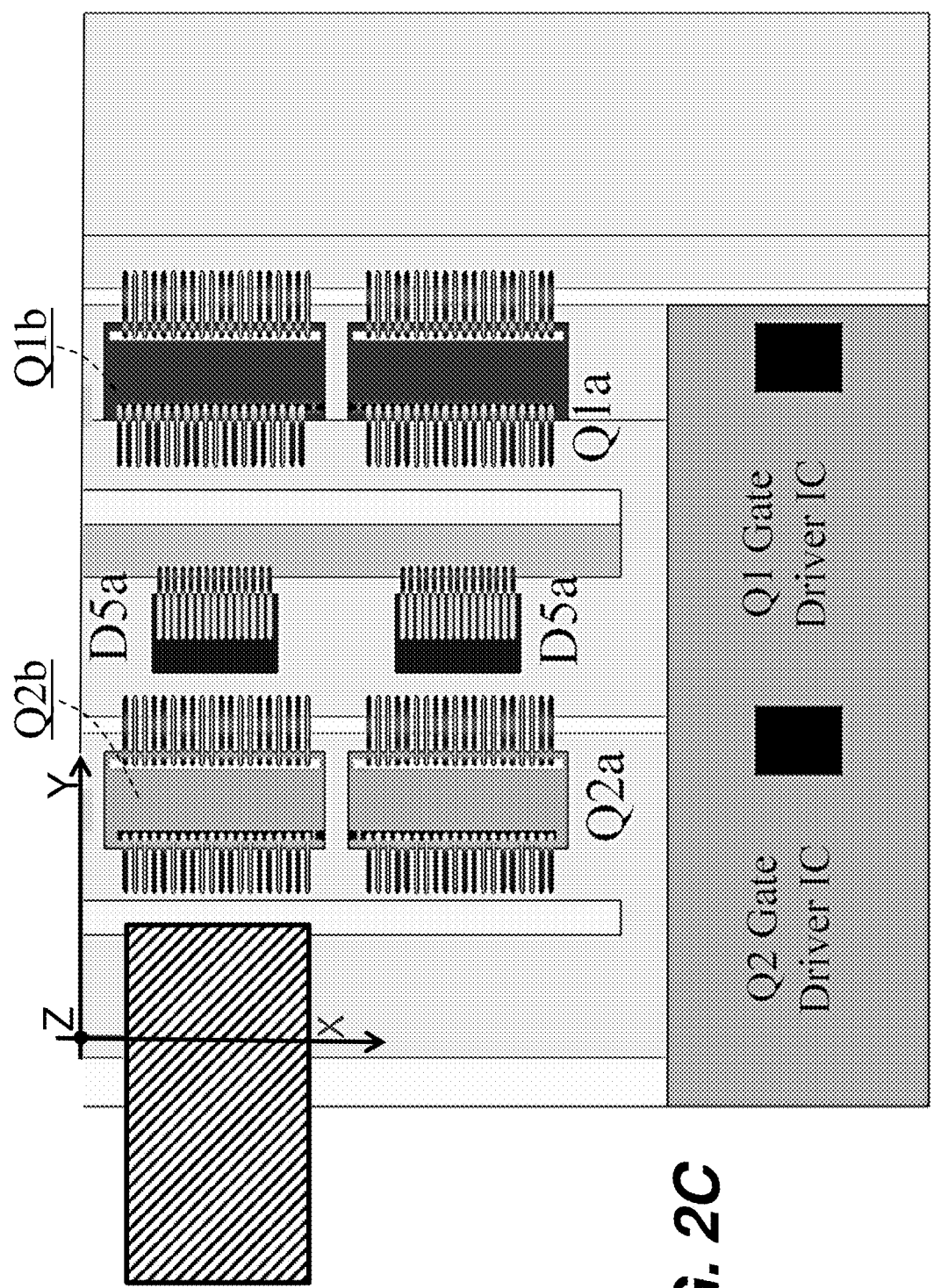
Figure 2D:
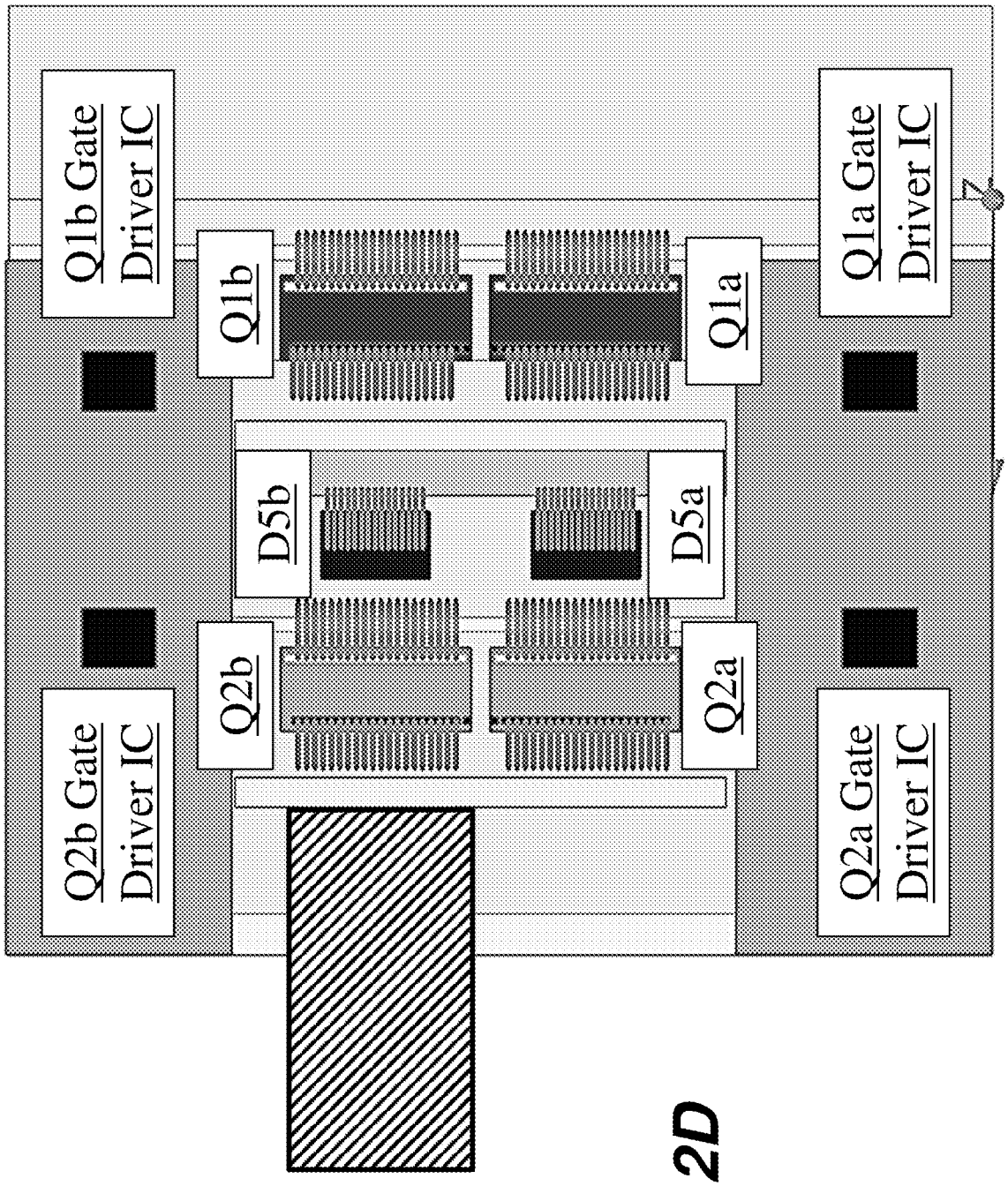

FIG. 2C illustrates an example gate driving board placed on one side (in the X-Y plane) of a mother substrate of the power module, whereas FIG. 2D illustrates an example gate driving board placed on both sides (in the X-Y plane) of a mother substrate of the power module. In a non-limiting example, physical materials or substrate(s) (e.g., directly, etc.) underneath each of these gate driving boards in FIG. 2C and FIG. 2D may not be those of direct bonded copper (DBC).

2.4. Distributed Terminal Designs

Distributed terminals such as wide DC bus terminals can be used for some or all positive, negative and neutral terminals to help achieve balanced current sharing among parallel dies of each of some or all semiconductor switch in the power module. These terminals can be specifically designed or spatially structured for mounting two sets of decoupling capacitors as well as providing mechanical support for the power module.

2.5. Decoupling Capacitors

Figure 5B:
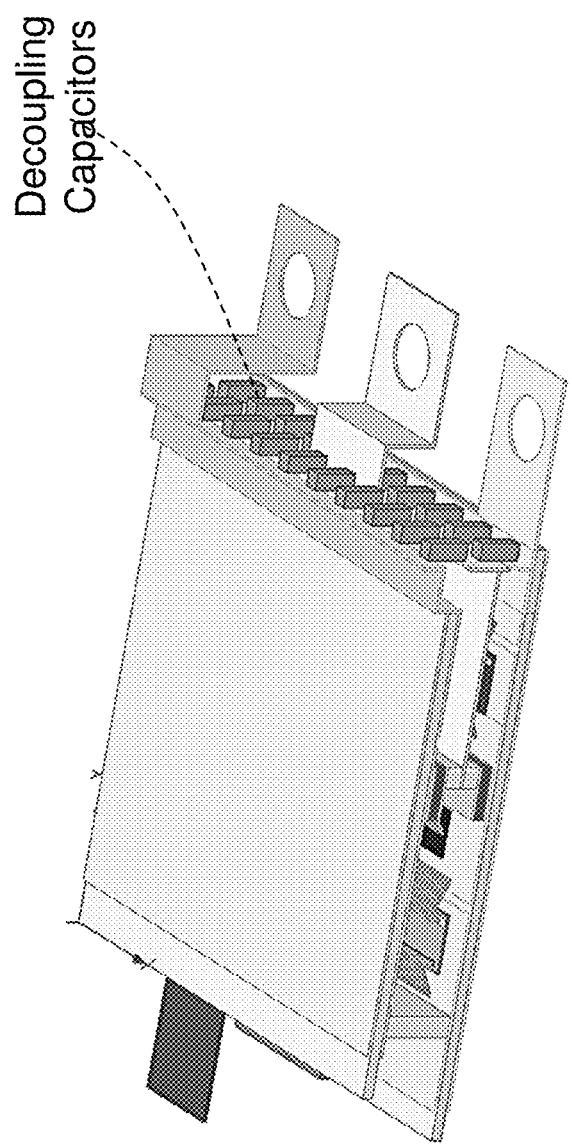

Decoupling capacitors are mounted on the (e.g., distributed, etc.) DC or power terminals away from the heat sources which are semiconductor devices/switches/ICs. At the same time, these capacitors can be cooled by cold plates attached with the power module to keep relatively low capacitor temperature to increase their service times. In addition, such a design facilitates replacement operations for some or all of decoupling capacitors after the power module is deployed in the field, as these capacitors may represent one of common failure points for power module operations. Those decoupling capacitors can be horizontally or vertically mounted on the wide power terminals. For example, as illustrated in FIG. 5A, decoupling capacitors may be horizontally mounted on the distributed terminals. Also as illustrated in FIG. 5B, decoupling capacitors may be vertically mounted on the distributed terminals.

2.6. Cooling Plate(s)

Figure 8A:
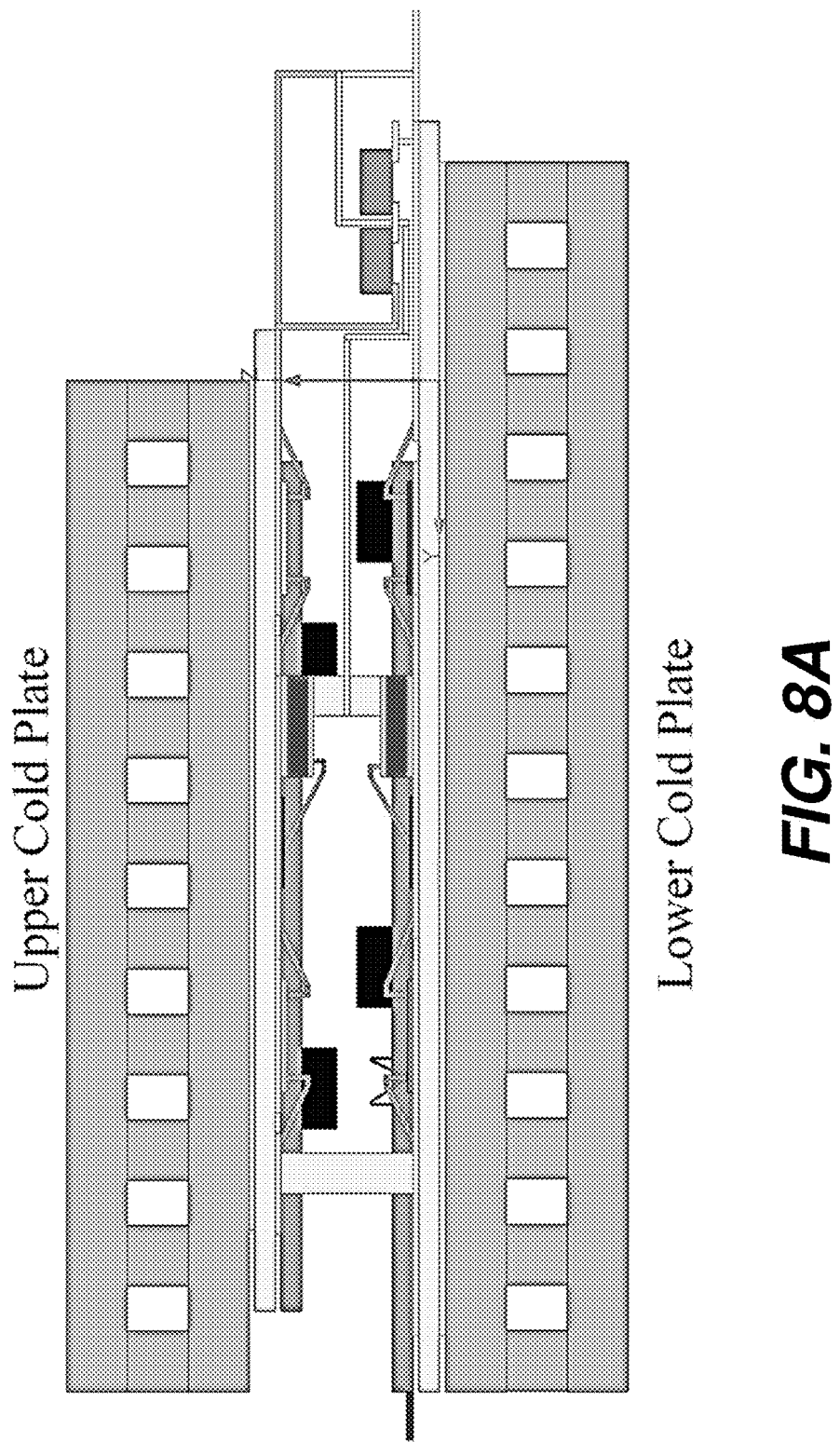
FIG. 8A and FIG. 8B illustrate example power modules with cooling plates.

Cooling plates may be used to keep the power module at a relatively low operational temperature. Some or all of the semiconductor devices/switches/ICs in the power module can be mounted on or in physical/thermal contact with one or both of two mother substrates such as direct bonded copper (DBC) substrates. Hence, one or both of those mother substrates can be in (e.g., direct, etc.) thermal or physical contact with one or more cooling plates to extract or dissipate heat generated by semiconductor switches/diodes and/or by other components of the power module in operation. FIG. 8A illustrates two example cooling plates used to sandwich the mother substrates of the power module in between. Hence, the power module is double-sided cooled, which can be used to support or achieve high-power density and compact design for the power module.

2.7. Mechanical Support and Interconnections

Figure 9A:
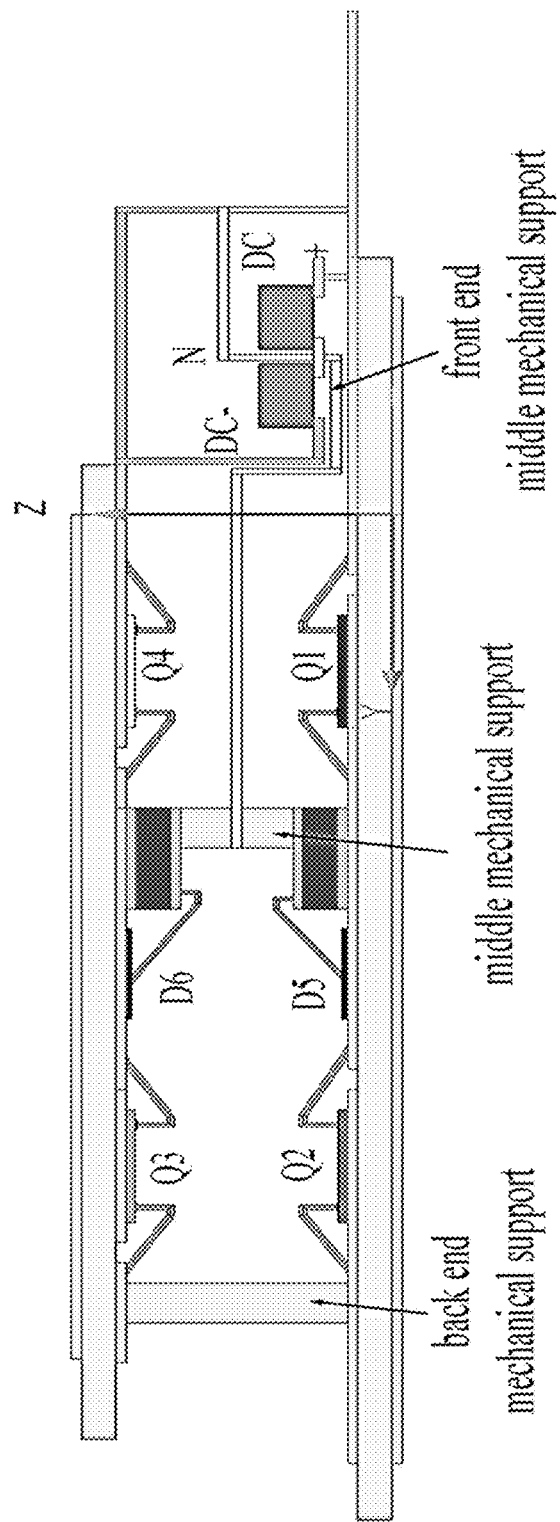
FIG. 9A and FIG. 9B illustrate example mechanical support for power modules.

The power module/device as described herein is mechanically robust as compared with other approaches such as PCB based power module/devices. Top and bottom substrates in the power module/device includes conductive (e.g., rigid, etc.) copper blocks/posts, which function as both as part of electrical paths in operation as well as mechanical support. As illustrated in FIG. 9A, there are three mechanical or copper supports in the power module/device. The first copper support is located in the front end (DC link side) of the power module/device. The second copper support is located in the middle of the power module/device. The third support is located in the back end (AC output side) of the power module/device. The DC+, DC− and N (neutral) terminals can be laminated copper bars with a thin layer of insulation material, such as Kapton tapes inserted between any two of those terminal bus bars. Additionally, optionally or alternatively, areas underneath the decoupling capacitors can be solid (materials) to provide mechanical or structural support. Hence, mechanical pressure from the cold plates sandwiching (the upper and lower mother substrates of) the power module/device can be well balanced as compared with other approaches that do not implement techniques as described herein.

To enable interconnection of semiconductor switches in the power module/device, pads of some or all of the semiconductor switches in the power module/device can be connected through bond wires. Additionally, optionally or alternatively, the semiconductor switches or their pads can be interconnected through other electrically and/or thermally conductive metal plates to shrink the clearance or spacing of substrates.

To enable interconnection of gate driving circuits or ICs and semiconductor switches, the gate driving circuit or IC components can be mounted on a rigid PCB. The gate driving circuits can be connected with gate pads of the semiconductor devices by bond wires. Additionally, optionally or alternatively, the PCB can be rigid/flex PCB with the components on the rigid part; the semiconductor switches and gate driving circuits can be connected by the flex part.

2.8. Example NPC Embodiments

According to one embodiment, a power module comprises: an upper arm structure that includes a first semiconductor switch, a second semiconductor switch and a first diode; a lower arm structure that includes a third semiconductor switch, a fourth semiconductor switch and a second diode; a first gate driving board, attached with the upper arm, the first gate driving board including a first gate driver connected to a first gate of the first semiconductor switch and a second gate driver connected to a second gate of the second semiconductor switch; a second gate driving board, attached with the lower arm, the second gate driving board including a third gate driver connected to a third gate of the third semiconductor switch and a fourth gate driver connected to a fourth gate of the fourth semiconductor switch.

In an embodiment, first electric currents of equal magnitudes flow in two short commutation loops when the power module operates in first operational states.

In an embodiment, second electric currents of equal magnitudes flow in two long commutation loops when the power module operates in second operational states.

In an embodiment, the upper arm structure includes a first mother substrate to which the first diode is directly attached;

the lower arm structure includes a second mother substrate to which the second diode is directly attached.

In an embodiment, the first semiconductor switch, the second semiconductor switch and the first diode on the upper arm structure form a spatial symmetry with the third semiconductor switch, the fourth semiconductor switch and the second diode on the lower arm structure.

In an embodiment, the power module further comprises: a direct current (DC) positive terminal (DC+); a DC negative terminal (DC−).

In an embodiment, spatial planes of the lower and upper arm structures are parallel to each other; the DC+ and DC− are vertically arranged relative to the spatial planes of the lower and upper arm structures.

In an embodiment, spatial planes of the lower and upper arm structures are parallel to each other; the DC+ and DC− are horizontally arranged relative to the spatial planes of the lower and upper arm structures.

In an embodiment, the first, second, third and fourth semiconductor switches include a first vertical Gallium Nitrate (GaN) switch disposed on the upper arm structure and a second vertical GaN switch disposed on the lower arm structure; the first and second vertical GaN switches form a spatial symmetry to each other.

In an embodiment, the first, second, third and fourth semiconductor switches include a first lateral Gallium Nitrate (GaN) switch disposed on the upper arm structure and a second lateral GaN switch disposed on the lower arm structure; the first and second lateral GaN switches form a spatial symmetry to each other.

In an embodiment, each of the first, second, third and fourth semiconductor switches includes two semiconductor switch dies.

In an embodiment, the first and second gate driving boards include a gate driving board that is centrally located in between the two semiconductor switch dies; the gate driving board includes a first gate driving circuit connected to a first die of the two semiconductor switch dies and a second gate driving circuit connected to a second die of the two semiconductor switch dies.

In an embodiment, the first and second gate driving boards include a gate driving board that is centrally located on a same side of the two semiconductor switch dies; wherein the gate driving board includes a first gate driving circuit connected to a first die of the two semiconductor switch dies and a second gate driving circuit connected to a second die of the two semiconductor switch dies.

In an embodiment, the first and second gate driving boards include a gate driving board having a first gate driving board portion located at a first side of the two semiconductor switch dies and a second gate driving board portion located at a second different side of the two semiconductor switch dies; the first gate driving board portion includes a first gate driving circuit connected to a first die of the two semiconductor switch dies; the second gate driving board portion includes a second gate driving circuit connected to a second die of the two semiconductor switch dies.

In an embodiment, the power module further comprises: an alternate current (AC) terminal.

In an embodiment, the AC terminal is located on a first side plane formed between the upper and lower art structures; a direct current (DC) positive terminal (DC+), a DC negative terminal (DC−), and a neutral terminal (N) of the power module are located on a second opposing plane formed between the upper and lower art structures.

In an embodiment, the DC+ and the N are electrically connected with a first group of decoupling capacitors; the DC− and the N are electrically connected with a second group of decoupling capacitors.

In an embodiment, the power module further comprises: two or more posts mechanically attached to the upper and lower arm structures.

In an embodiment, the upper arm structure is attached to a first cooling plate on a first side of the power module; the lower arm structure is attached to a second different cooling plate on a second opposing side of the power module.

In an embodiment, one or more of the first, second, third and fourth semiconductor switches and the first and second diodes are attached to one or more of two mother substrates of the upper and lower arm structures by way of one or more daughter substrates.

3.0. ANPC Design

Under some approaches, three level ANPC (3L ANPC) topology with WBG devices may be implemented by directly mounting semiconductor devices on a printed circuit board (PCB). One benefit from these ANPC devices may be to better balance power loss distributions over time in realtime field operations as compared with the NPC devices. The thermal performance of such an approach and the electric current carrying capability of PCBs are relatively low. Hence, a supported power level of such an approach may be limited to relatively low power applications.

Embodiments are directed to relatively low power-loop inductance, relatively low gate-drive-loop inductance, relatively low semiconductor junction-to-coolant thermal resistance and relatively low-profile power modules/devices, as compared with existing power modules/devices. A power module as described herein may implement a three-level active neutral point clamped (ANPC) topology or design with ultra-fast WBG semiconductor such as gallium nitride (GaN).

Example advantages and/or benefits provided by some or all the embodiments as described herein include, but are not necessarily limited to only: relatively low power loop inductance; integrated gate driving circuits (with semiconductor switches such as GaN-based switches); relatively low gate loop inductance; symmetrical layout with scalable (e.g., with a total number of semiconductor switches such as GaN-based switches, etc.) design; distributed terminals for balanced current sharing among (e.g., spatially, etc.) paralleled dies (containing/including semiconductor switches); decoupling capacitors on the power terminals; double-sided cooling; mechanically robust; stacking substrates design; support for Flex PCB (as well as non-Flex PCB) interconnection of gate driving circuits and/or semiconductor switches.

3.1. ANPC Power Module Assembly

An example module/device assembly process flow for assembling an ANPC power module may include, but is not necessarily limited to only, any, some or all of the following steps.

Figure 1C:
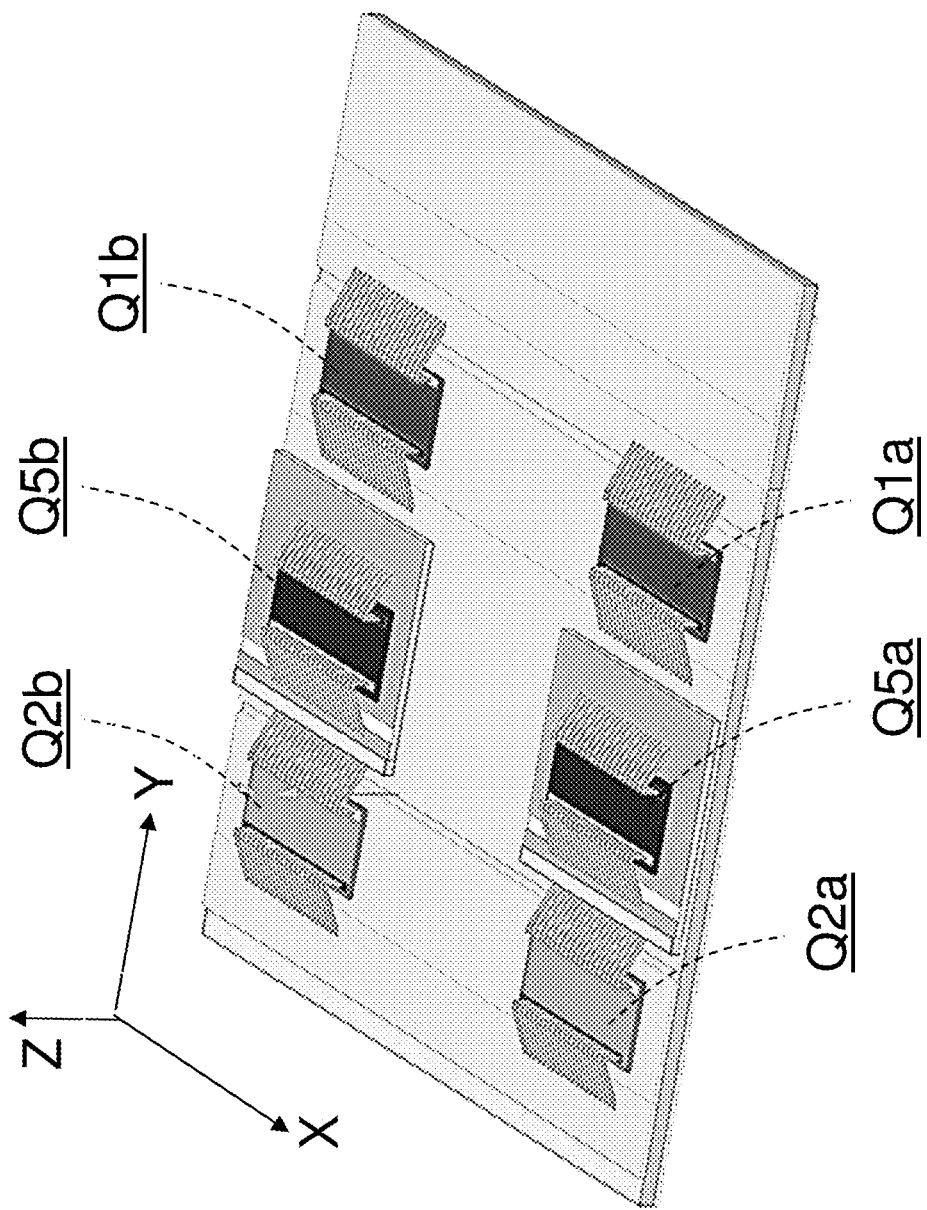
Figure 1D:
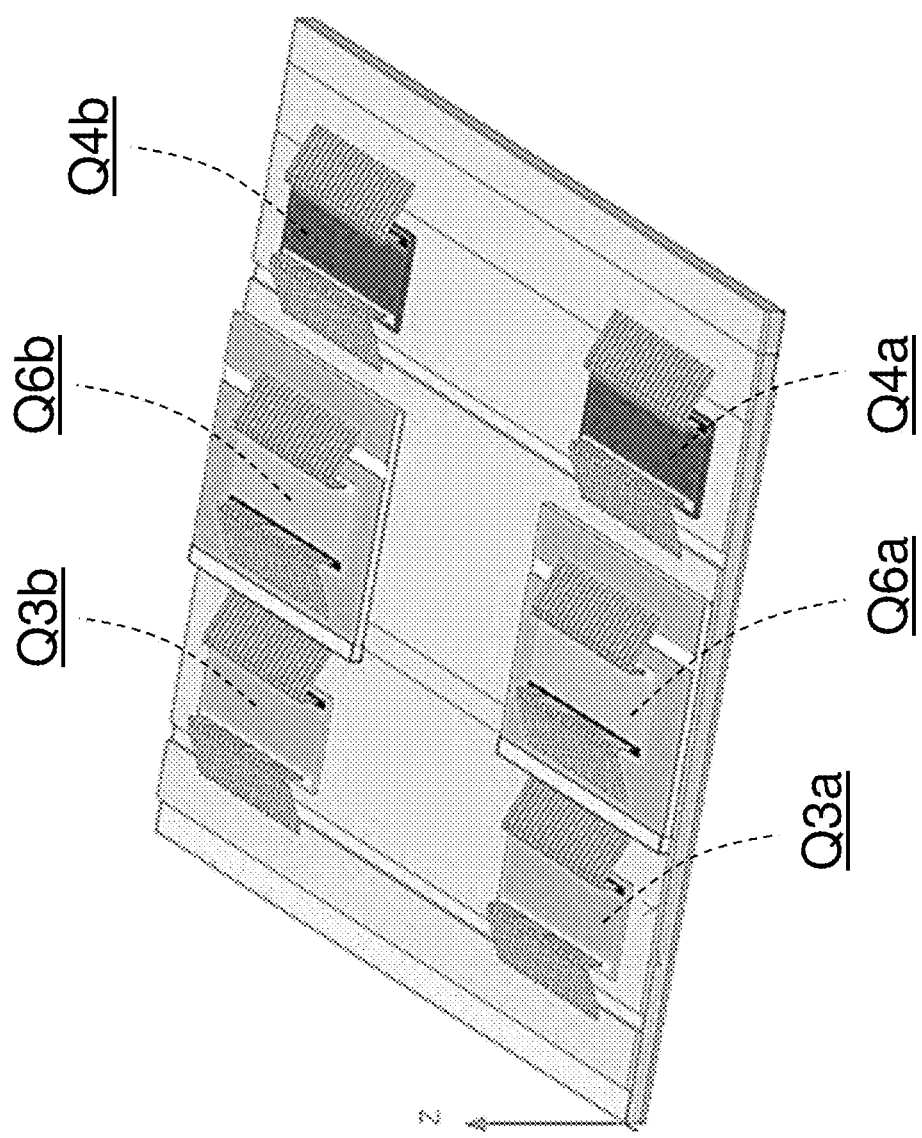

The module/device assembly process flow may include Step 1, in which (two) daughter substrates and dies for semiconductor switches therewith are sintered to (two) mother substrates, respectively, as shown in FIG. 1C and FIG. 1D. The semiconductor switches or dies containing the semiconductor switches may then be electrically interconnected through wire bonding. In a non-limiting example, GaN devices or switches used herein may be of a lateral type with active regions such as gate, drain and source being all at one side. Under techniques as described herein, these GaN devices or switches can be assembled or packaged with vertical arrangement of peripheral circuits such as bus bars. Wire bonds may be used to bond all these active regions to the DBC first. The DBC can be connected to other bus bars in any manners convenient for the assembly. As illustrated in FIG. 2E through FIG. 2H, a switch gate as described herein may be at the same side of source, for example both facing upwards. Wires may be bonded directly from the gate and source to the gate driver boards. Additionally, optionally or alternatively, some or all techniques as described herein can be implemented with other switch types such as vertical devices/switches, SiC/Si devices/switches, which may have both gate and source facing up.

For the purpose of illustration only, FIG. 1C depicts a first mother substrate to which one or more first daughter substrates—mounted or disposed with first dies Q2a and Q2b, Q5a, Q5b, Q1a and Q1b—are sintered. Similarly, FIG. 1D depicts a second mother substrate to which one or more second daughter substrates—mounted or disposed with second dies for Q3a, Q3b, Q6a, Q6b, Q4a and Q4b—are sintered.

In some operational scenarios, each semiconductor switch as described herein may be formed by one or more separate dies electrically connected in parallel. For example, as illustrated in FIG. 1C and FIG. 1D, the dies Q1a and Q1b may be electrically connected in parallel and form a semiconductor switch Q1. The dies Q2a and Q2b may be electrically connected in parallel and form a second semiconductor switch Q2. The dies Q3a and Q3b may be electrically connected in parallel and form a semiconductor switch Q3. The dies Q4a and Q4b may be electrically connected in parallel and form a second semiconductor switch Q4. The dies Q5a and Q5b may be electrically connected in parallel and form a semiconductor switch Q5. The dies Q6a and Q6b may be electrically connected in parallel and form a semiconductor switch Q6.

Figure 2E:
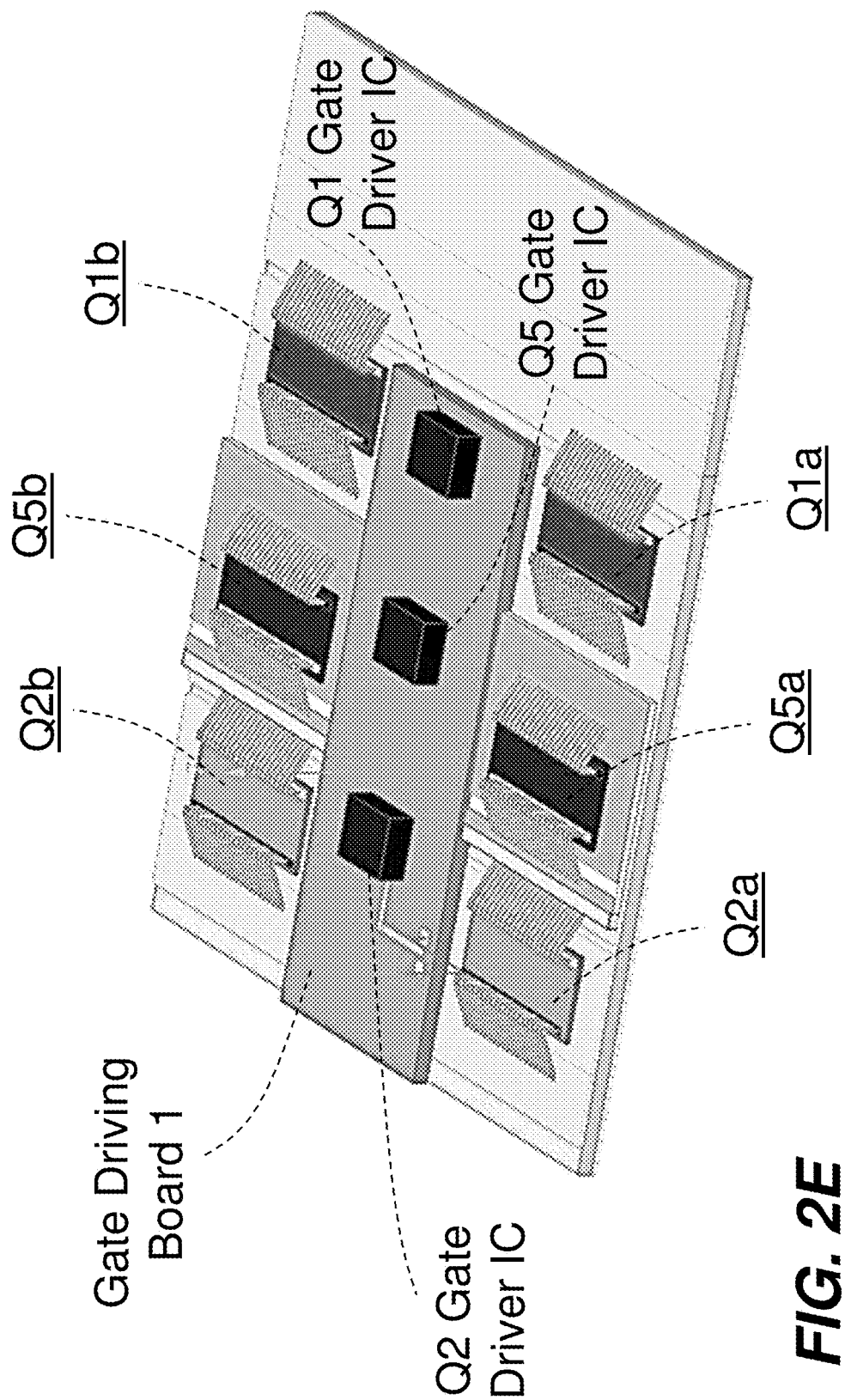
Figure 2F:
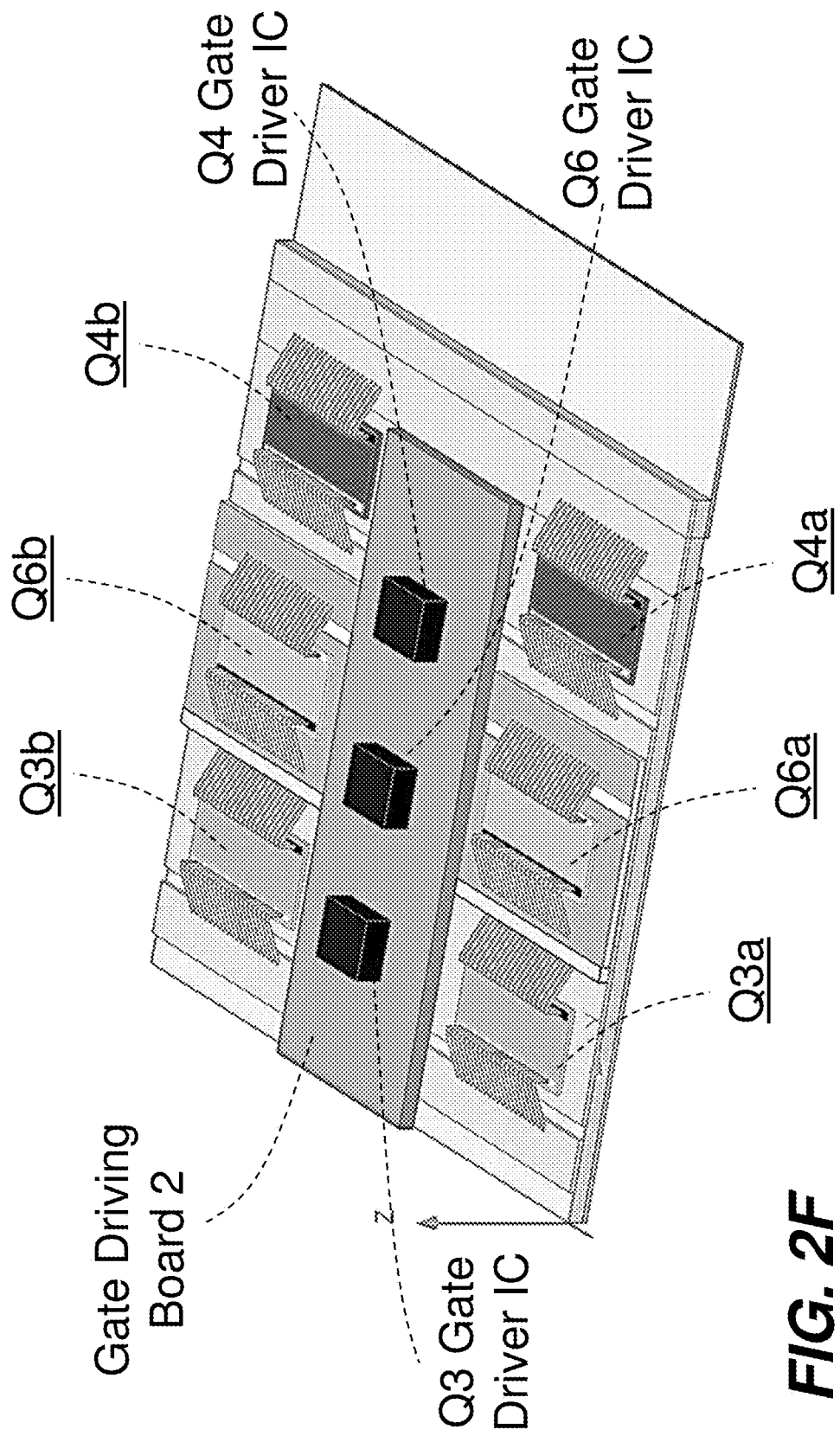

The module/device assembly process flow for assembling an ANPC power module may include Step 2, in which (two) gate drive boards are assembled or attached to the (two) mother substrates, respectively, as shown in FIG. 2E and FIG. 2F. The gate drive boards may include gate driver ICs for some or all of the semiconductor switches. Gate pads of some or all of the semiconductor switches may be electrically connected with the gate driver ICs on the gate driver boards.

As illustrated in FIG. 2E, a first gate drive board is assembled or attached to the first mother substrate of FIG. 1C. The first gate drive board includes a first gate driver IC for the semiconductor switch Q2, a second gate driver IC for the semiconductor switch Q1, and a fifth gate driver IC for the semiconductor switch Q5. Gate pads of the semiconductor switch Q2 may be electrically connected with the first gate driver IC. Gate pads of the semiconductor switch Q1 may be electrically connected with the second gate driver IC. Gate pads of the semiconductor switch Q5 may be electrically connected with the fifth gate driver IC.

Also as illustrated in FIG. 2F, a second gate drive board is assembled or attached to the second mother substrate of FIG. 1D. The second gate drive board includes a third gate driver IC for the semiconductor switch Q3, a fourth gate driver IC for the semiconductor switch Q4, and a sixth gate driver IC for the semiconductor switch Q6. Gate pads of the semiconductor switch Q3 may be electrically connected with the third gate driver IC. Gate pads of the semiconductor switch Q4 may be electrically connected with the fourth gate driver IC. Gate pads of the semiconductor switch Q6 may be electrically connected with the sixth gate driver IC.

Figure 3B:
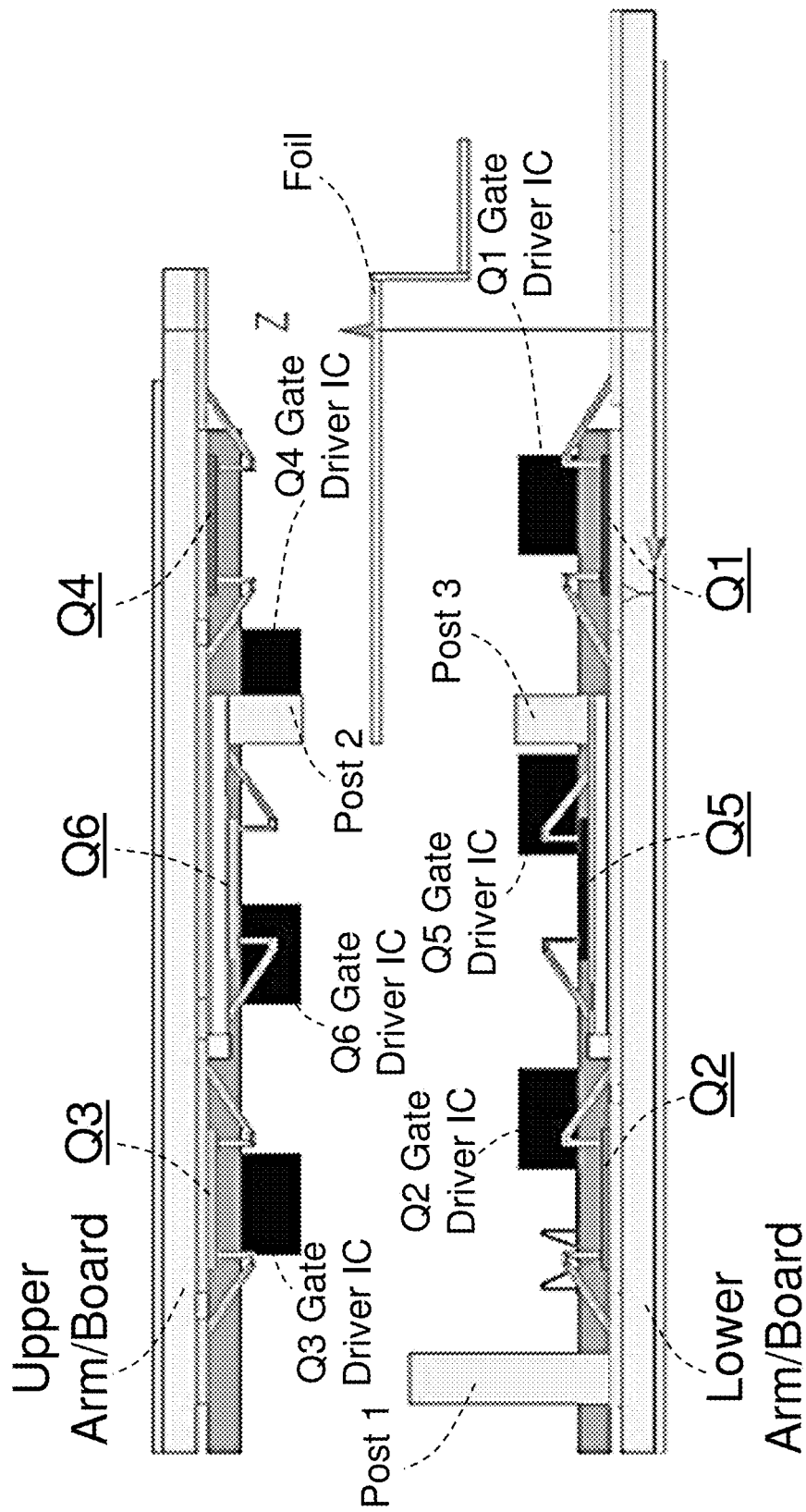

The module/device assembly process flow for assembling an ANPC power module may include Step 3, in which posts such as copper posts conductive posts, a (e.g., single, etc.) neutral terminal, and so are mounted, attached, or otherwise disposed with one or both of the two mother substrates. As illustrated in FIG. 3B, one of the posts, namely, post 2 is mounted, attached or otherwise disposed with the second mother substrate of FIG. 2F, whereas posts 1 and 3 are mounted, attached or otherwise disposed with the first mother substrate of FIG. 2E. The first and second mother substrates of FIG. 2E and FIG. 2F with the posts are then assembled with foil such as copper or conductive foil, etc., to form an electrically and/or mechanically interconnected module/device.

More specifically, the second mother substrate of FIG. 2F serves as an upper arm or board along a spatial direction represented by Z, whereas the first substrate of FIG. 2E serves as a lower arm or board along the same spatial direction (Z). The spatial direction (Z) may form a three-dimensional Cartesian coordinate system with two other spatial directions represented by X and Y (perpendicular to each other and Z), respectively. Both the first and second mother substrates may be (e.g., exactly, substantially, etc.) of a planar shape along the X and Y spatial directions as illustrated in FIG. 1C.

The electrically and/or mechanically interconnected module/device may be assembled by placing or moving the upper arm/board downward or toward the lower arm/board, (1) until post 1 disposed with the lower arm/board is in actual (e.g., physical, mechanical, electrical, etc.) contact with the upper arm/board and (2) until post 2 disposed with the upper arm/board is in actual (e.g., physical, mechanical, electrical, etc.) contact with the foil, post 3 disposed with the lower arm/board and any intervening physical (e.g., thermally and/or electrically conductive, thermally and/or electrically insulating, etc.) materials.

Figure 4B:
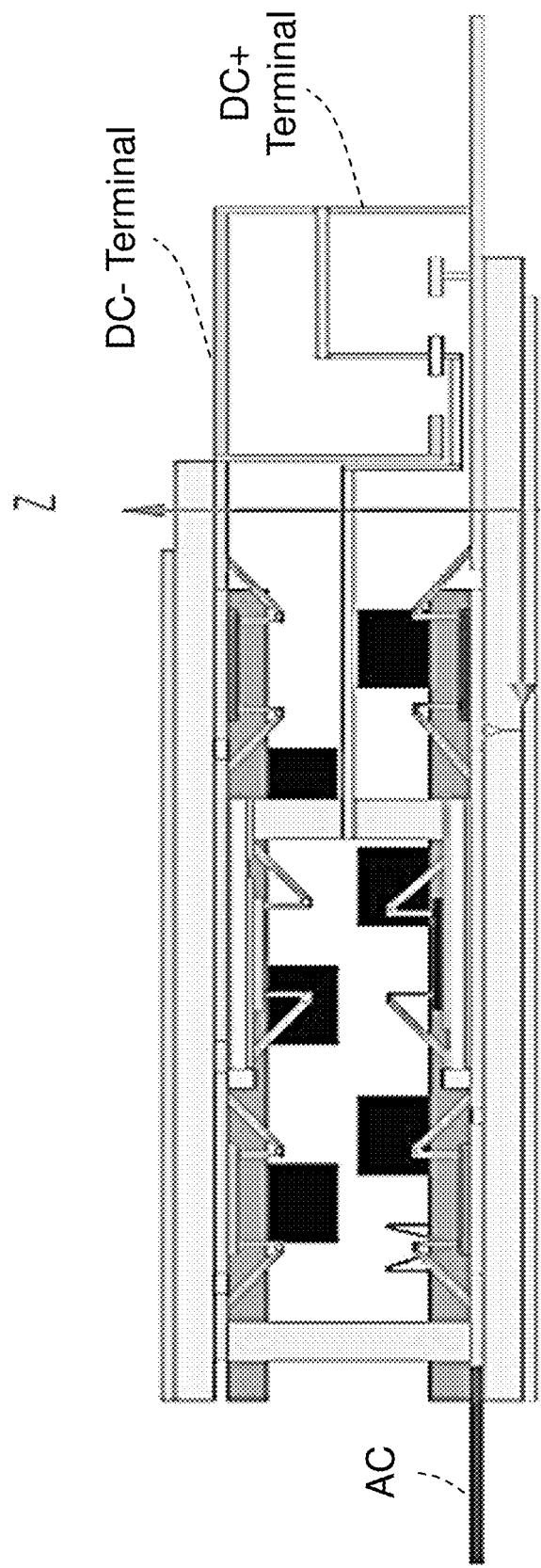
Figure 5C:
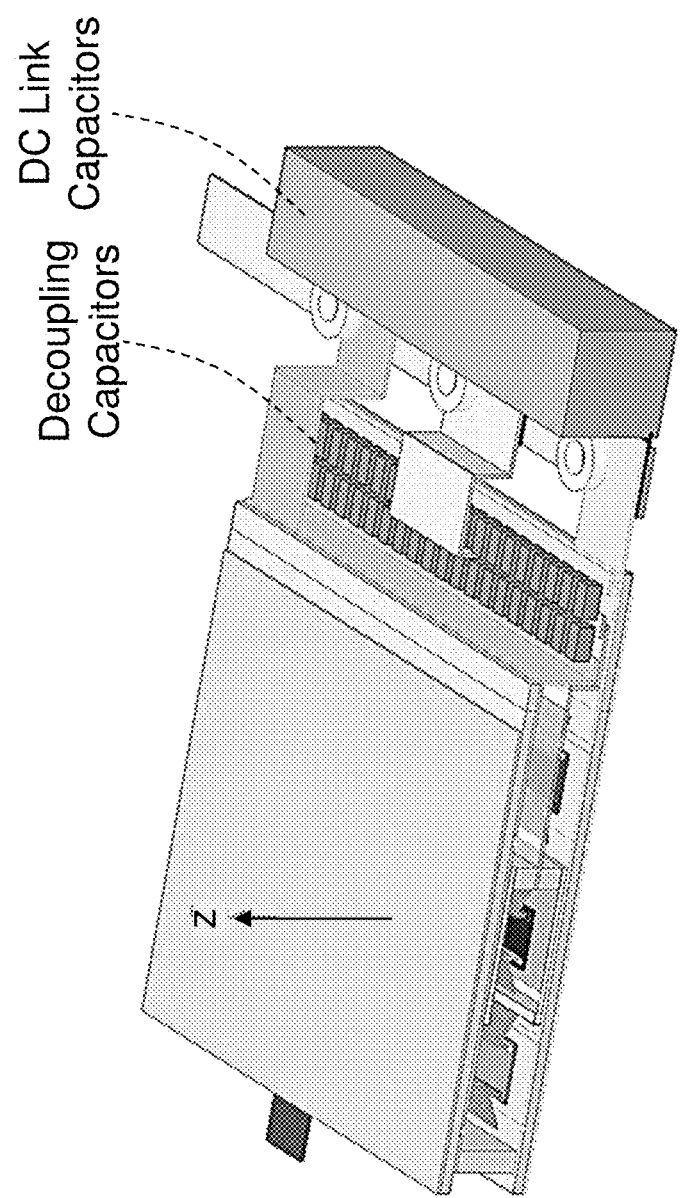

The module/device assembly process flow for assembling an ANPC power module may include Step 4, in which other parts such as other terminals (e.g., DC+, DC−, neutral point or terminal, etc.) may be assembled into the module/device from Step 3 to form the module/device of FIG. 4B; and Step 5, in which decoupling capacitors and DC link capacitors may be assembled into the module/device from Step 4 to form the (e.g., final, functional, power switch, power inverter, to be attached with cooling plates on the upper and lower surfaces of the module, etc.) module/device of FIG. 5C.

3.2. Minimizing Power Loop Inductances

Figure 6B:
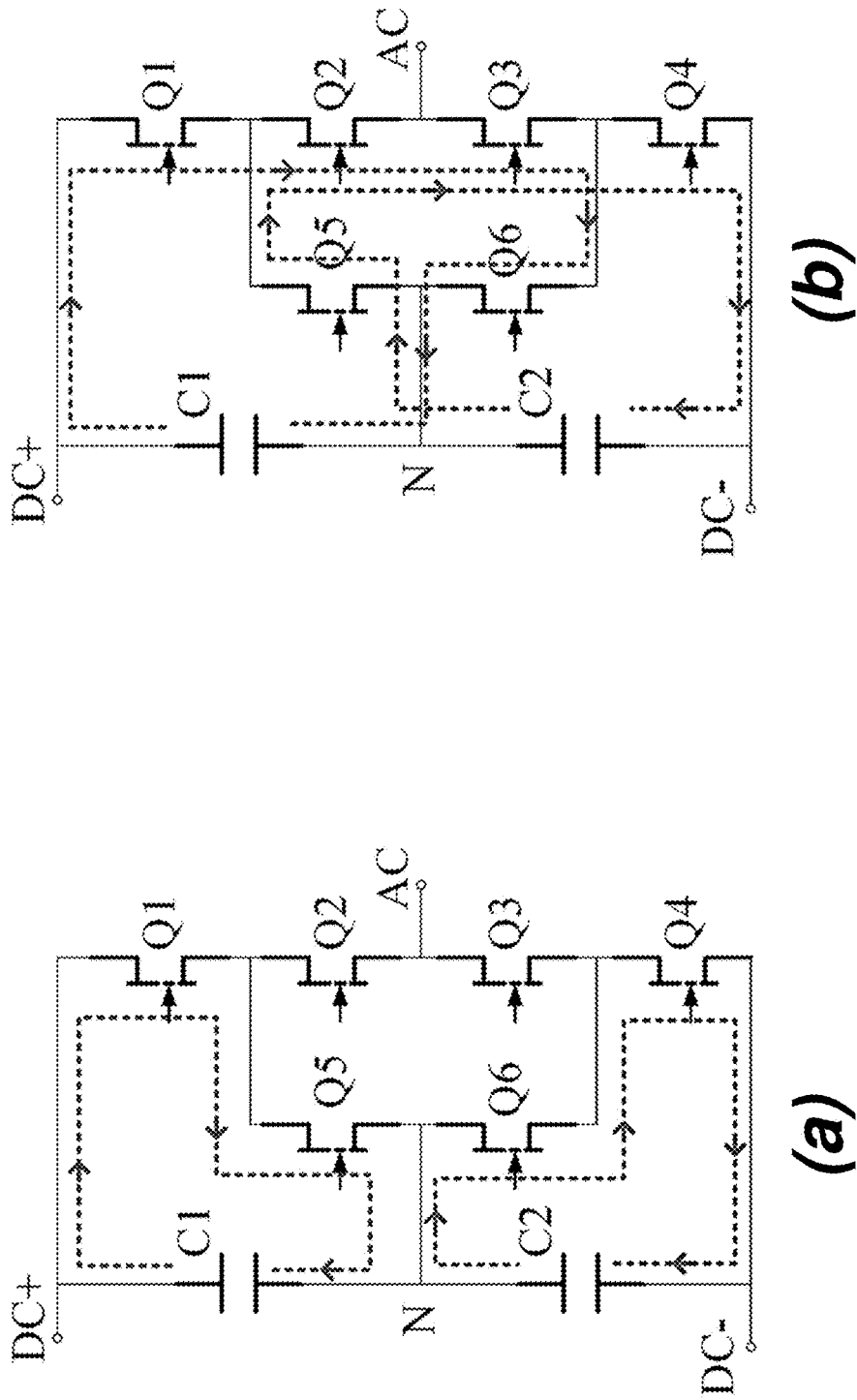
Figure 7B:
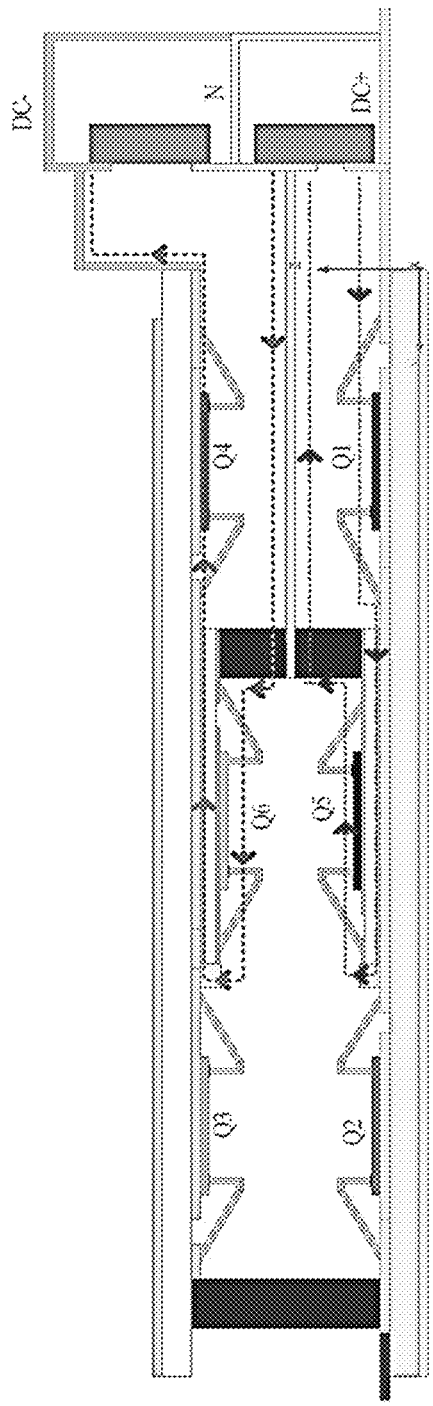
Figure 7B:
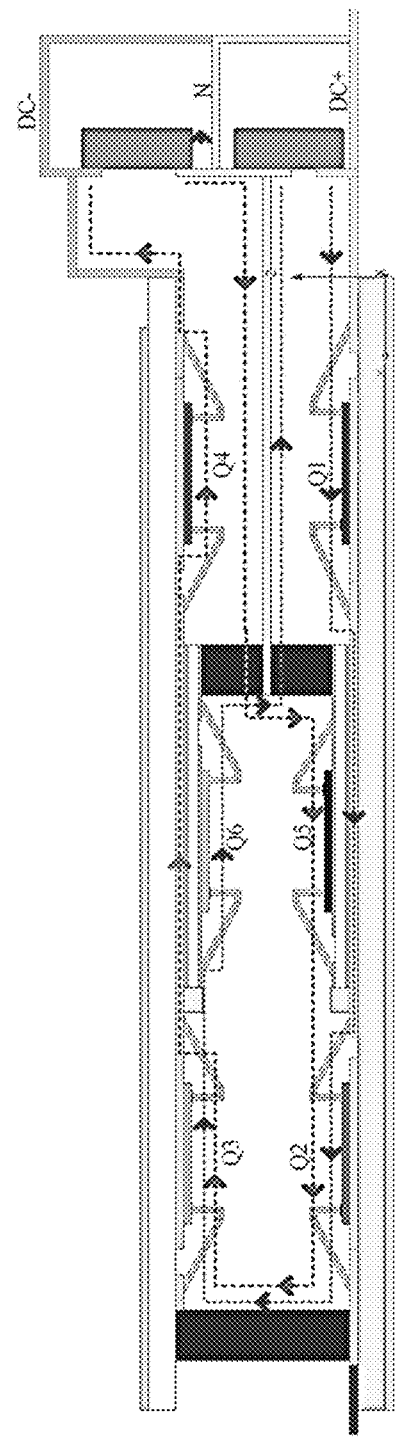

An ANPC power module assembled under techniques as described herein produces relatively low power loop inductance in (e.g., realtime, actual, field, etc.) operation. FIG. 6B and FIG. 7B illustrate example short commutation loops and long commutation loops when the power module operates in first operational/switching states (corresponding to two first different quadrants in four quadrants) and second different operational/switching states (corresponding to two second different quadrants in four quadrants), respectively. Each of these commutation loops represents a specific DC electric current flow through a number of specific components such as specific semiconductor switches in the ANPC power module. The specific DC electric current flow in the corresponding commutation loop can be effectuated by using gate driver ICs to set gates of the semiconductor switches to specific gate states.

More specifically, FIG. 6B (a)—along with FIG. 7B (a)—illustrates two short commutation loops (e.g., sharing or being clamped to the same neural terminal, etc.) formed when the power module operates in the first operational/switching states or quadrants.

FIG. 6B (b)—along with FIG. 7B (b)—illustrates two long commutation loops (e.g., sharing or being clamped to the same neural terminal, etc.) formed when the power module operates in the second operational/switching states or quadrants.

Flux cancelling is one of effective methods to reduce the loop inductance. By maximizing the negative mutual inductance, the total loop inductance is minimized. As illustrated in FIG. 6B and FIG. 7B, the forward current paths and the backward current paths of both the short and long commutation loops are fully overlapped, so that the magnetic flux can be canceled to the maximum extent. Additionally, optionally or alternatively, in operational scenarios in which wire-bonding connection is replaced by copper or conductive foil connection, the distance between the two mother substrates (e.g., DBCs, etc.) and the distance between the neutral terminal and mother substrates (DBCs in the present example) can be further shortened. Consequently, the loop inductances can be further reduced.

3.3. Gate Driving Board Placement

Gate driving electric currents flowing through the gate driver ICs integrated with (e.g., gate lines of, etc.) the semiconductor switches may be relatively small as compared with power loop electric currents flowing in the power loops illustrated in FIG. 6B and FIG. 7B. The gate driving electric currents may generate magnetic fluxes and hence generate (e.g., relatively low, etc.) gate driving loop inductances. In some operational scenarios, the gate driving loop inductances can be minimized by the shorting (conductive or copper) trace length(s) and/or by implementing flux cancellation by concurrent gate driving loops with opposite loop directions.

As illustrated in FIG. 2E and FIG. 2F, a symmetrical layout and scalable design may be used to arrange semiconductor switches and gate driving ICs. For example, two dies (e.g., Q1$a$ and Q1$b$, etc.) may be used in parallel for each semiconductor switch (e.g., Q1, etc.). The gate driving board on which the gate driving ICs are mounted or attached may be placed in the middle of the mother substrates in the power module. Hence, both the power loops and gate driving loops can be made symmetrical. One of the prominent benefits under techniques as described herein is balanced current sharing among the parallel dies of each of the semiconductor switches while the power module is in operation.

The power module design as described herein is also scalable with two or more dies in parallel (or parallelized) for each semiconductor switch to increase the overall power rating or capacity of the power module. One or more sets of gate driving circuits or ICs can be used accordingly. One or more gate driving boards can also be at on one or both sides (e.g., upper and/or lower side(s) in the X-Y plane of each of the mother substrates, etc.) of the power module. In some operational scenarios, the symmetry of the gate driving loops may be lost or may not be maintained while the symmetry of the power loop can be maintained. In some operational scenarios, physical materials or substrate(s) (e.g., directly, etc.) underneath the gate driving board need not to be those of direct bonded copper (DBC), which may reduce or lower costs for DBC in the power module.

Figure 2G:
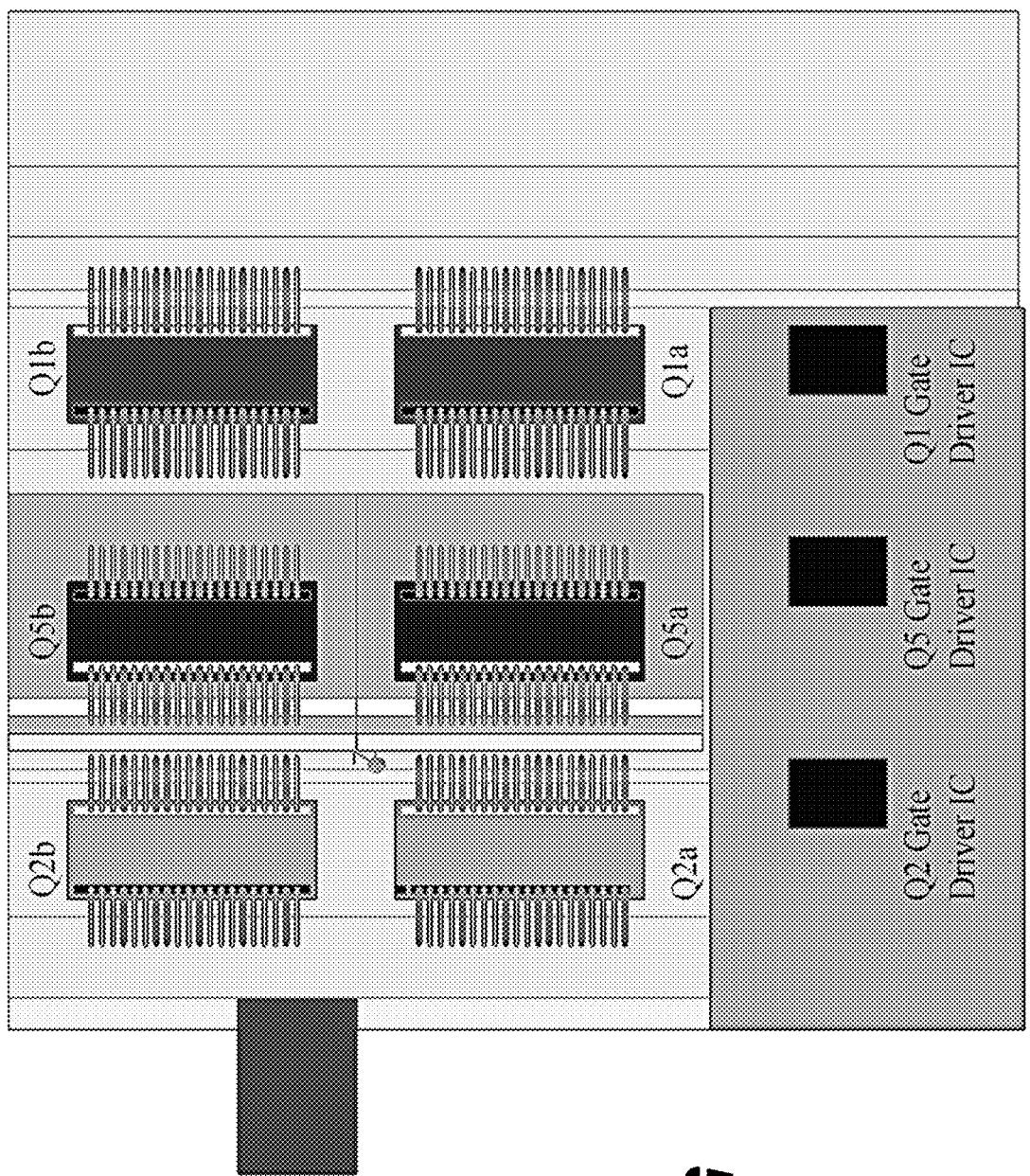
Figure 2H:
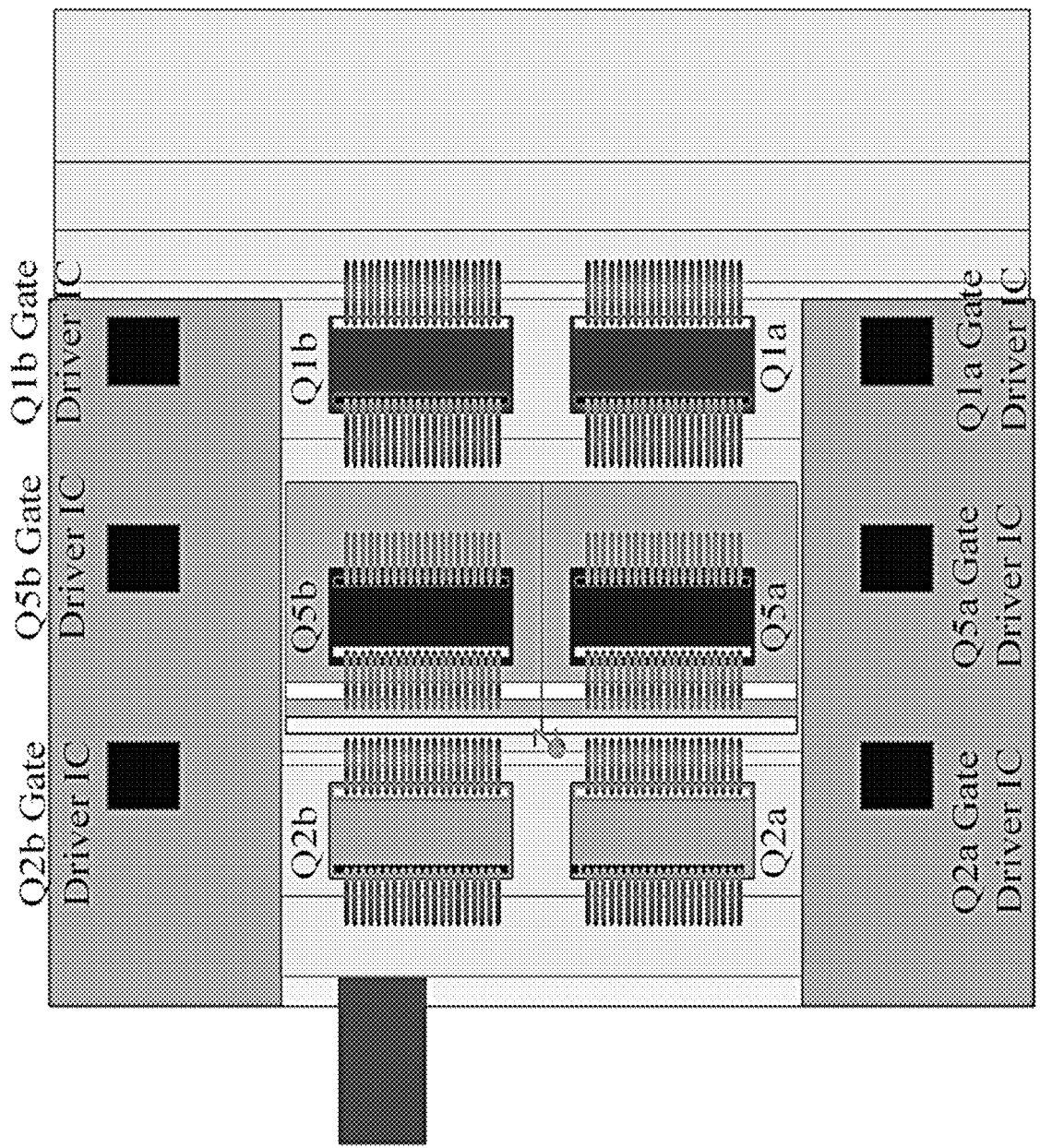

FIG. 2G illustrates an example gate driving board placed on one side (in the X-Y plane) of a mother substrate of the power module, whereas FIG. 2H illustrates an example gate driving board placed on both sides (in the X-Y plane) of a mother substrate of the power module. Physical materials or substrate(s) (e.g., directly, etc.) underneath each of these gate driving boards in FIG. 2G and FIG. 2H need not to be those of direct bonded copper (DBC).

3.4. Distributed Terminal Designs

Distributed terminals such as wide DC bus terminals can be used for some or all positive, negative and neutral terminals to help achieve balanced current sharing among parallel dies of each of some or all semiconductor switch in the power module. These terminals can be specifically designed or spatially structured for mounting two sets of decoupling capacitors as well as providing mechanical support for the power module.

3.5. Decoupling Capacitors

Figure 5D:
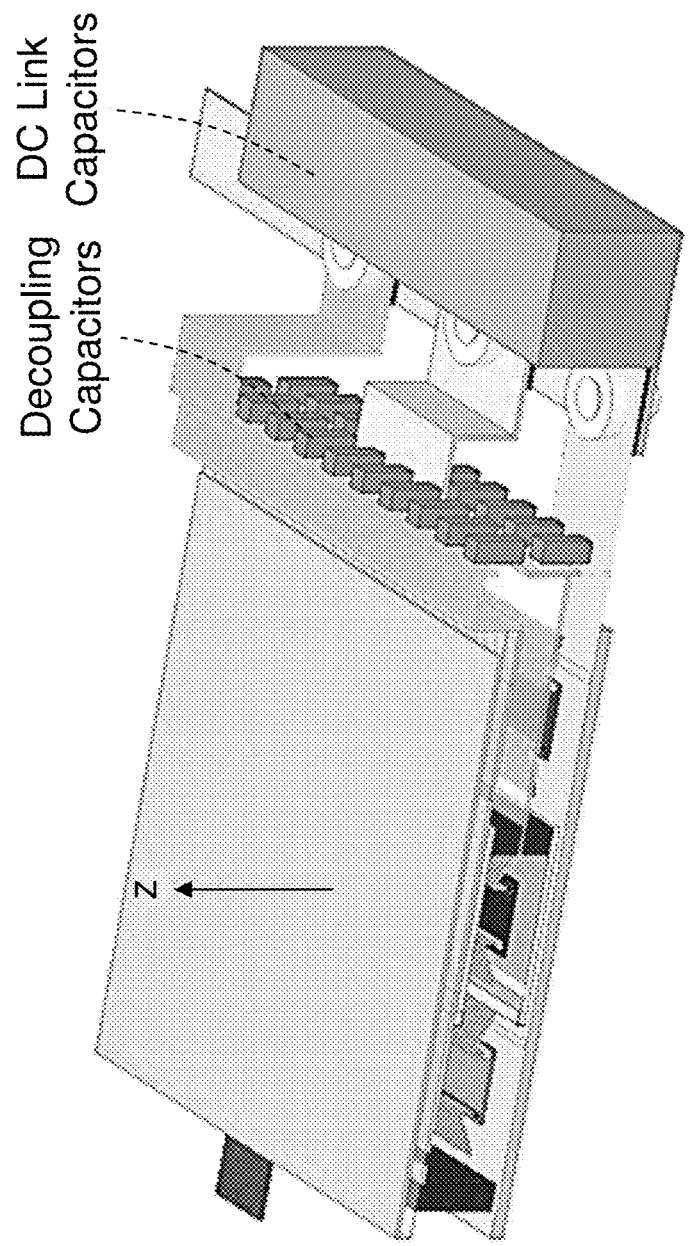

Decoupling capacitors are mounted on the (e.g., distributed, etc.) DC or power terminals away from the heat sources which are semiconductor devices/switches/ICs. At the same time, these capacitors can be cooled by cold plates attached with the power module to keep relatively low capacitor temperature to increase their service times. In addition, such a design facilitates replacement operations for some or all of decoupling capacitors after the power module is deployed in the field, as these capacitors may represent one of common failure points for power module operations. Those decoupling capacitors can be horizontally or vertically mounted on the wide power terminals. For example, as illustrated in FIG. 5C, decoupling capacitors may be horizontally mounted on the distributed terminals. Also as illustrated in FIG. 5D, decoupling capacitors may be vertically mounted on the distributed terminals.

3.6. Cooling Plate(s)

Figure 8B:
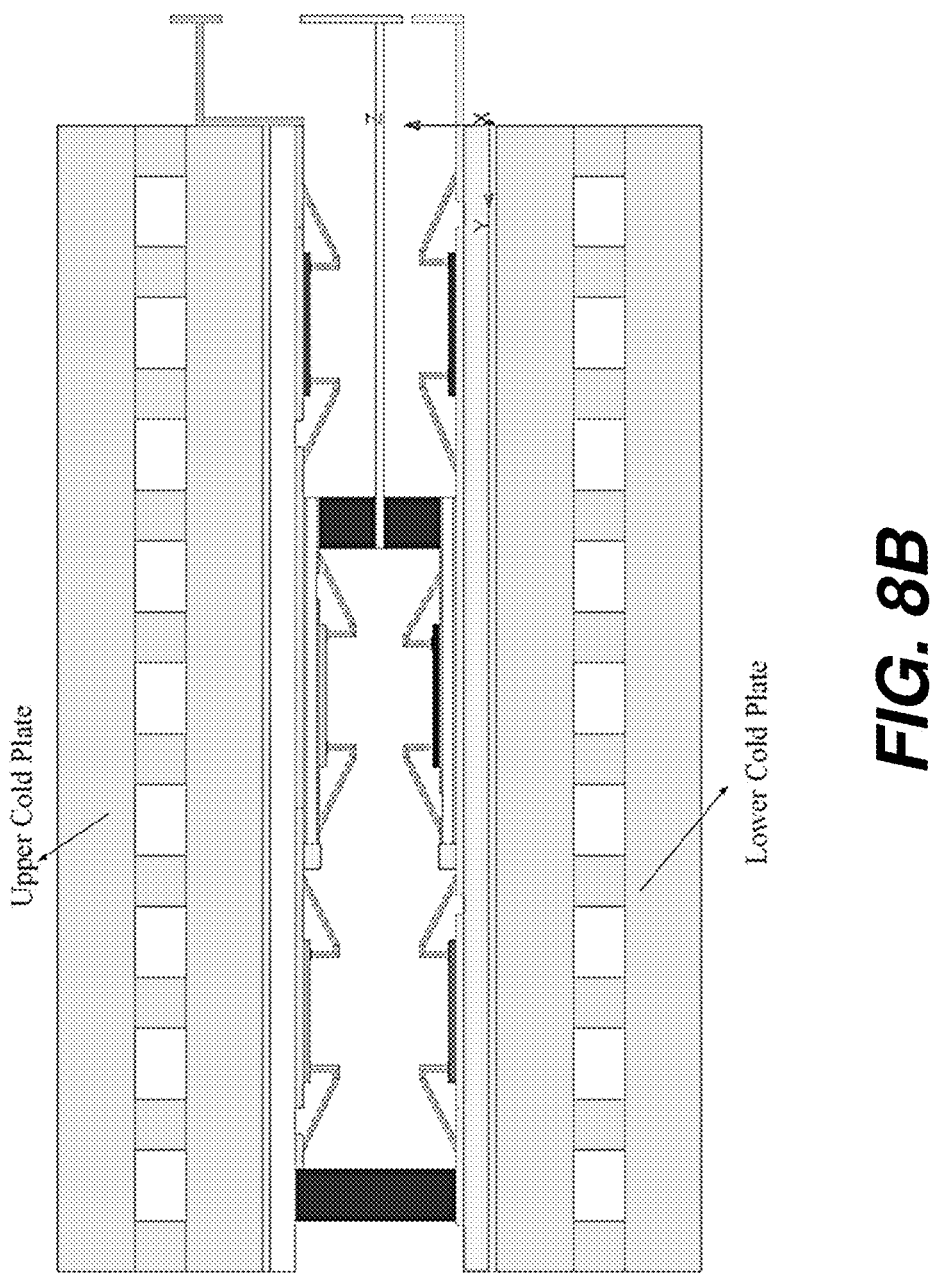

Cooling plates may be used to keep the power module at a relatively low operational temperature. Some or all of the semiconductor devices/switches/ICs in the power module can be mounted on or in physical/thermal contact with one or both of two mother substrates such as direct bonded copper (DBC) substrates. Hence, one or both of those mother substrates can be in (e.g., direct, etc.) thermal or physical contact with one or more cooling plates to extract or dissipate heat generated by semiconductor switches and/or by other components of the power module in operation. FIG. 8B illustrates two example cooling plates used to sandwich the mother substrates of the power module in between. Hence, the power module is double-sided cooled, which can be used to support or achieve high-power density and compact design for the power module.

3.7. Mechanical Support and Interconnections

Figure 9B:
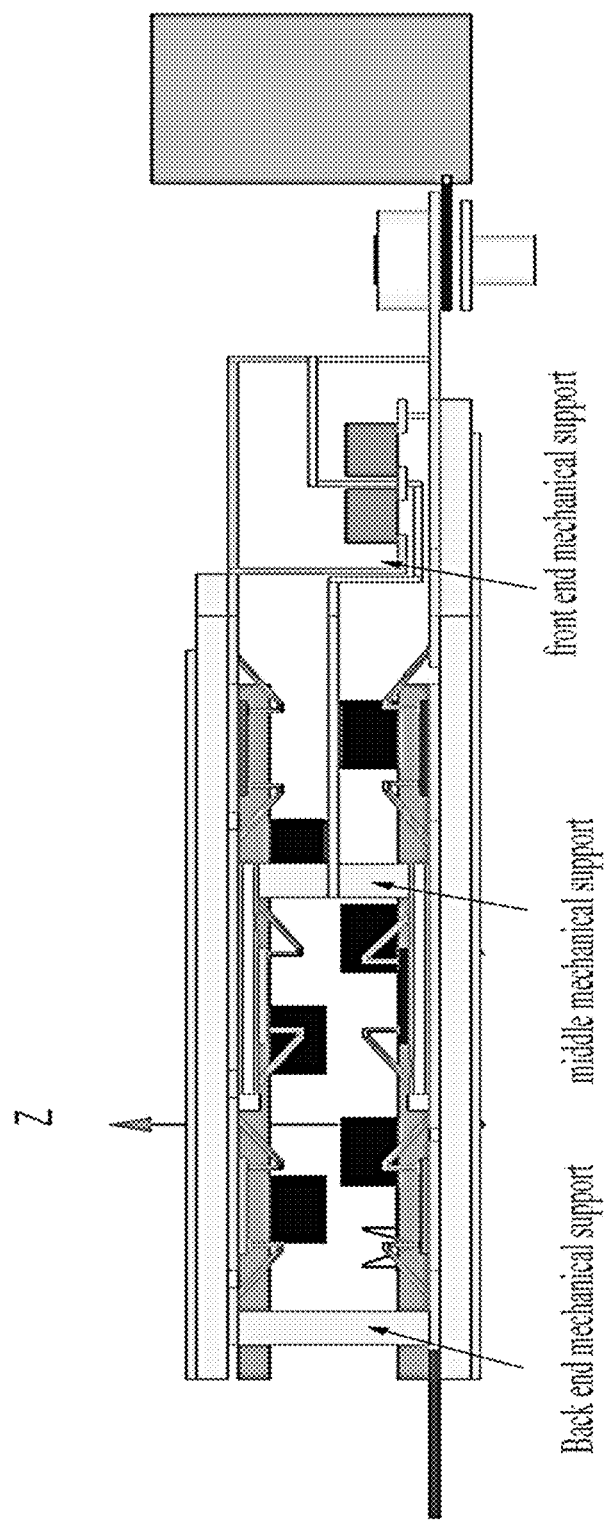

The power module/device as described herein is mechanically robust as compared with other approaches such as PCB based power module/devices. Top and bottom substrates in the power module/device includes conductive (e.g., rigid, etc.) copper blocks/posts. These blocks/posts can function as both as part of electrical paths in operation as well as mechanical support. As illustrated in FIG. 9B, there are three mechanical or copper supports in the power module/device. The first copper support is located in the front end (DC link side) of the power module/device. The second copper support is located in the middle of the power module/device. The third support is located in the back end (AC output side) of the power module/device. The DC+, DC− and N (neutral) terminals can be laminated copper bars with a thin layer of insulation material, such as Kapton tapes inserted between any two of those terminal bus bars. Additionally, optionally or alternatively, areas underneath the decoupling capacitors can be solid (materials) to provide mechanical or structural support. Hence, mechanical pressure from the cold plates sandwiching (the upper and lower mother substrates of) the power module/device can be well balanced as compared with other approaches that do not implement techniques as described herein.

To enable interconnection of semiconductor switches in the power module/device, pads of some or all of the semiconductor switches in the power module/device can be connected through bond wires. Additionally, optionally or alternatively, the semiconductor switches or their pads can be interconnected through other electrically and/or thermally conductive metal plates to shrink the clearance or spacing of substrates.

To enable interconnection of gate driving circuits or ICs and semiconductor switches, the gate driving circuit or IC components can be mounted on a rigid PCB. The gate driving circuits can be connected with gate pads of the semiconductor devices by bond wires. Additionally, optionally or alternatively, the PCB can be a rigid/flex PCB with the components on the rigid part; the semiconductor switches and gate driving circuits can be connected by the flex part.

3.8. Stacking Substrates Design

Figure 10:
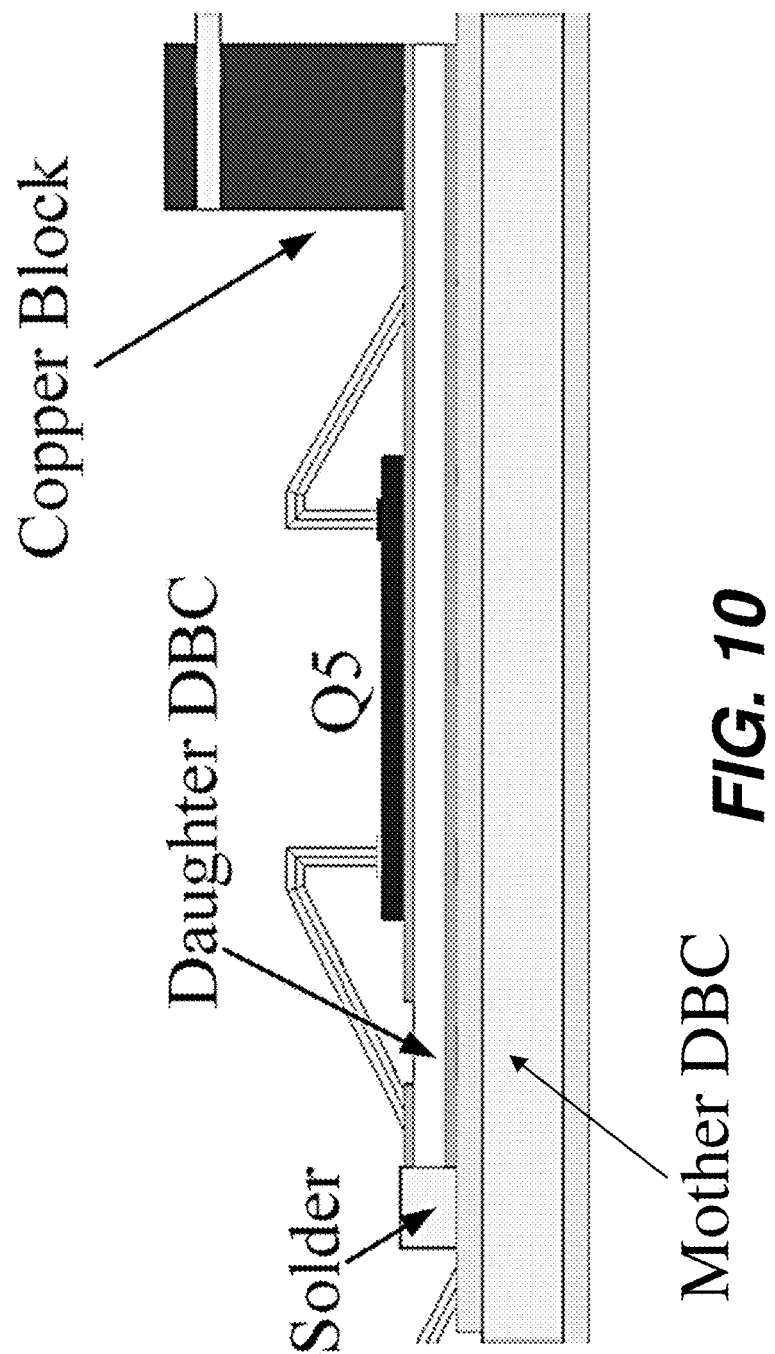
FIG. 10 illustrates an example design for stacking substrates.

One or more daughter substrates as described herein may be patched on a mother DBC substrate to provide or accommodate interconnections of semiconductor devices such as three power semiconductor switches by providing one or more additional or other conduction layers, as illustrated in FIG. 10. In an example, one or more edges of the daughter substrates can be connected to the mother (e.g., DBC, etc.) substrate by conductive solder. Hence, a relatively high symmetry of the power loop and gate loop may be maintained, thereby helping cancel or reduce magnetic fluxes or changes thereof and reducing parasitic loop inductances.

Additionally, optionally or alternatively, isolated islands could be created on the mother substrate instead of or in addition to using patched daughter substrates. The symmetry of the power loops might be lost, and the size of the power module might increase, for example laterally along one or both or the spatial dimensions of the mother substrate for the purpose of accommodating additional switch(es) which could otherwise be mounted on daughter substrate(s) separate from and stacked over the mother substrate.

3.9. Example ANPC Embodiments

According to an embodiment, a power module comprises: an upper arm structure that includes a first semiconductor switch, a second semiconductor switch and a fifth semiconductor switch; a lower arm structure that includes a third semiconductor switch, a fourth semiconductor switch and a sixth semiconductor switch; a first gate driving board, attached with the upper arm, the first gate driving board including a first gate driver connected to a first gate of the first semiconductor switch, a second gate driver connected to a second gate of the second semiconductor switch, and a third gate driver connected to a fifth gate of the fifth semiconductor switch; a second gate driving board, attached with the lower arm, the second gate driving board including a third gate driver connected to a third gate of the third semiconductor switch, a fourth gate driver connected to a fourth gate of the fourth semiconductor switch, and a sixth gate driver connected to a sixth gate of the sixth semiconductor switch.

In an embodiment, first electric currents of equal magnitudes flow in two short commutation loops when the power module operates in first operational states.

In an embodiment, second electric currents of equal magnitudes flow in two long commutation loops when the power module operates in second operational states.

In an embodiment, the upper arm structure includes a first mother substrate to which the fifth semiconductor switch is directly attached; the lower arm structure includes a second mother substrate to which the sixth semiconductor switch is directly attached.

In an embodiment, the first, second and fifth semiconductor switches on the upper arm structure form a spatial symmetry with the third, fourth and sixth semiconductor switches on the lower arm structure.

In an embodiment, the power module further comprises: a direct current (DC) positive terminal (DC+); a DC negative terminal (DC−).

In an embodiment, spatial planes of the lower and upper arm structures are parallel to each other; the DC+ and DC− are vertically arranged relative to the spatial planes of the lower and upper arm structures.

In an embodiment, spatial planes of the lower and upper arm structures are parallel to each other; the DC+ and DC− are horizontally arranged relative to the spatial planes of the lower and upper arm structures.

In an embodiment, the first, second, third, fourth, fifth and sixth semiconductor switches include a first vertical Gallium Nitrate (GaN) switch disposed on the upper arm structure and a second vertical GaN switch disposed on the lower arm structure; the first and second vertical GaN switches form a spatial symmetry to each other.

In an embodiment, the first, second, third, fourth, fifth and sixth semiconductor switches include a first lateral Gallium Nitrate (GaN) switch disposed on the upper arm structure and a second lateral GaN switch disposed on the lower arm structure; the first and second lateral GaN switches form a spatial symmetry to each other.

In an embodiment, each of the first, second, third, fourth, fifth and sixth semiconductor switches includes two semiconductor switch dies.

In an embodiment, the first and second gate driving boards include a gate driving board that is centrally located in between the two semiconductor switch dies; the gate driving board includes a first gate driving circuit connected to a first die of the two semiconductor switch dies and a second gate driving circuit connected to a second die of the two semiconductor switch dies.

In an embodiment, the first and second gate driving boards include a gate driving board that is centrally located on a same side of the two semiconductor switch dies; the gate driving board includes a first gate driving circuit connected to a first die of the two semiconductor switch dies and a second gate driving circuit connected to a second die of the two semiconductor switch dies.

In an embodiment, the first and second gate driving boards include a gate driving board having a first gate driving board portion located at a first side of the two semiconductor switch dies and a second gate driving board portion located at a second different side of the two semiconductor switch dies; the first gate driving board portion includes a first gate driving circuit connected to a first die of the two semiconductor switch dies; the second gate driving board portion includes a second gate driving circuit connected to a second die of the two semiconductor switch dies.

In an embodiment, the power module further comprises: an alternate current (AC) terminal.

In an embodiment, the AC terminal is located on a first side plane formed between the upper and lower arm structures; a direct current (DC) positive terminal (DC+), a DC negative terminal (DC−), and a neutral terminal (N) of the power module are located on a second opposing plane formed between the upper and lower art structures.

In an embodiment, the DC+ and the N are electrically connected with a first group of decoupling capacitors; the DC− and the N are electrically connected with a second group of decoupling capacitors.

In an embodiment, the power module further comprises: two or more posts mechanically attached to the upper and lower arm structures.

In an embodiment, the upper arm structure is attached to a first cooling plate on a first side of the power module; the lower arm structure is attached to a second different cooling plate on a second opposing side of the power module.

In an embodiment, one or more of the first, second, third, fourth, fifth and sixth semiconductor switches are attached to one or more of two mother substrates of the upper and lower arm structures by way of one or more daughter substrates.

4.0. Extensions and Alternatives

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

In the foregoing specification, embodiments of the disclosure have been described with reference to numerous specific details that may vary from implementation to implementation. Thus, the sole and exclusive indicator of what is the disclosure, and is intended by the applicants to be the disclosure, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

5.0. Appendix

Figure 17A:
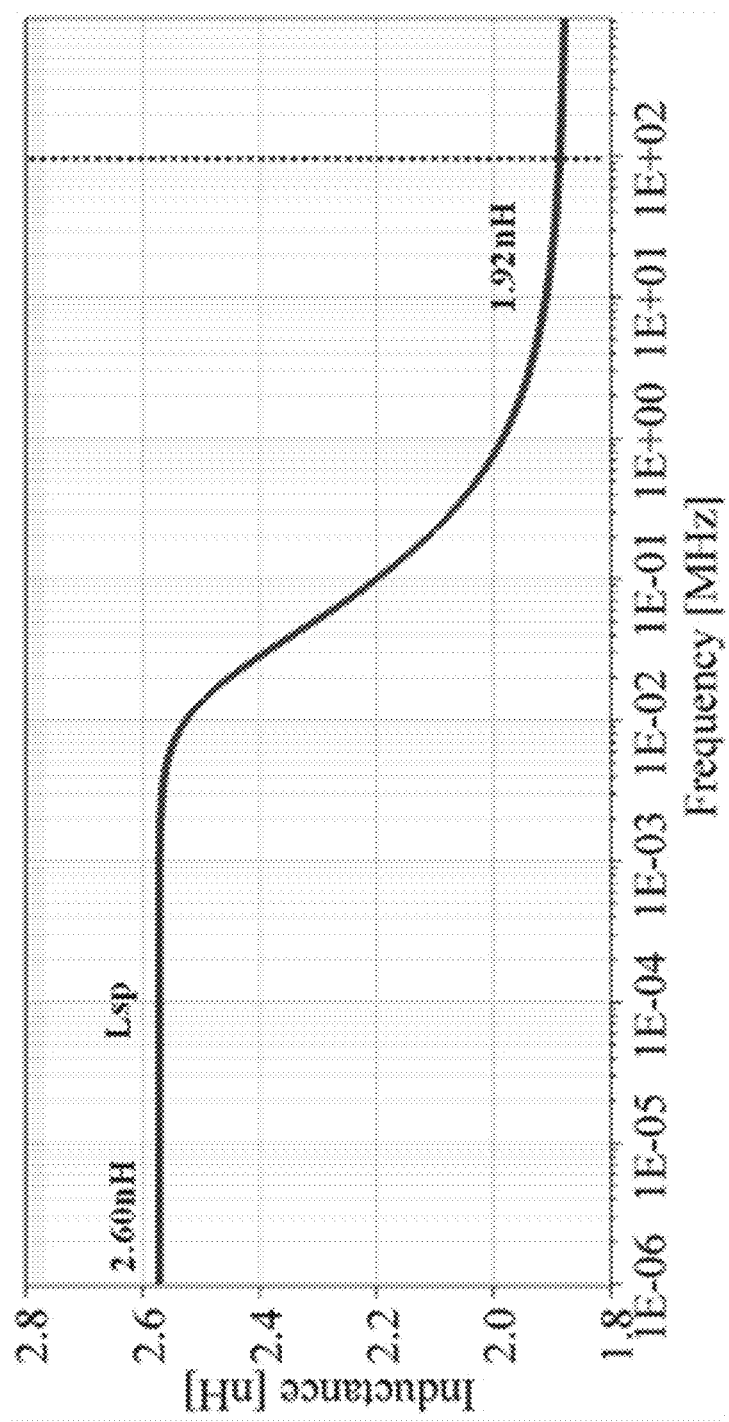
FIG. 17A illustrates example simulated power loop inductance for the short commutation loops inductance.
Figure 17B:
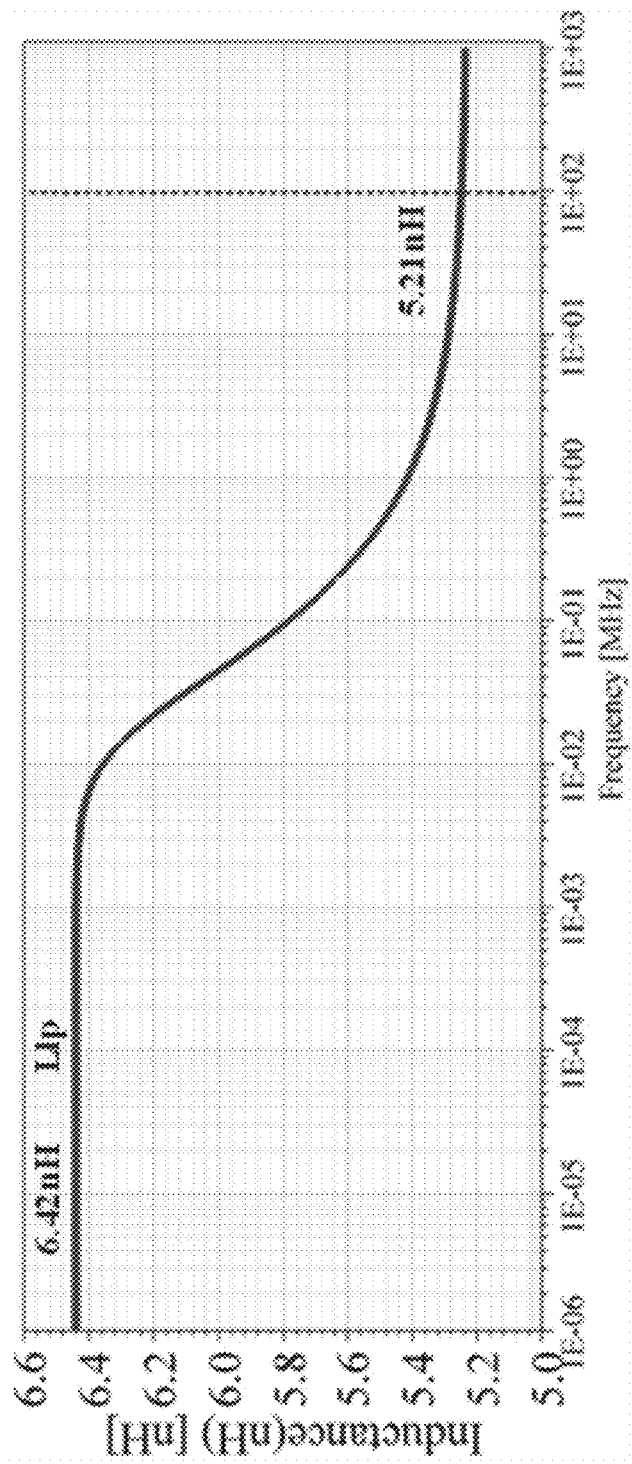
FIG. 17B illustrates example simulated power loop inductance for the long commutation loops.

Packaging a 100 kW All-GaN-based Three-level Active Neutral Point Clamped Power Module for Electric Vehicle Motor Drives Abstract—This paper, to the best knowledge of the authors, for the first time reports the packaging of a 100 kW 3-level active neutral point clamped (3L-ANPC) phase leg power module for electric vehicle (EV) traction inverter applications using 650V/150 A e-mode gallium nitride high-electron-mobility transistors (GaN HEMTs). Compared with two-level (2L) half bridge power module, the main challenges of packaging 3L-ANPC phase leg power module are high number of switches (6 switches vs 2 switches) and multiple commutation loops (1 commutation loop vs 4 commutation loops). In addition, there are four switches involved in the two long commutation loops. Those parasitic loop inductances must be minimized simultaneously. Those challenges are addressed by meticulous packaging of the power module, featuring low power loop inductances, double-sided cooled power module, low junction-to-coolant thermal resistance, symmetrical layout for the two parallel dies of each switch and mechanical robustness, etc. As shown in FIGS. 17 (a) and (b), the simulated loop inductances are 1.92 nH for the short loops and 5.21 nH for the long loops, respectively; resulting in a 471V and 540V of turn-off voltage spikes in a double pulse test simulation at 400V/200 A. The simulated junction-to-coolant thermal resistances are 0.37° C./W and 0.53° C./W for different switches, respectively.

Keywords—GaN packaging, 3L-ANPC, power module, double-sided cooling, EV traction inverter

I. INTRODUCTION

For next generation EVs, the power ratings of traction motors are increasing from tens of kW to hundreds of kW and the voltages of battery packs are also increasing from 400V to 800V, which call for EV traction inverters with a rated power of 100 kW or higher at a DC bus voltage of 800V [1, 2]. Meanwhile, the targeted power density of the EV traction inverter listed by U.S. DRIVE (Driving Research and Innovation for Vehicle efficiency and Energy sustainability) is increasing from 13.4 kW/L by 2020 to 33 kW/L by 2025 [3], making GaN HEMT a promising candidate due to its fast switching speed and low switching loss that can result in smaller heatsinks and footprints, and smaller passives by switching at higher switching frequency [4].

Figure 11:
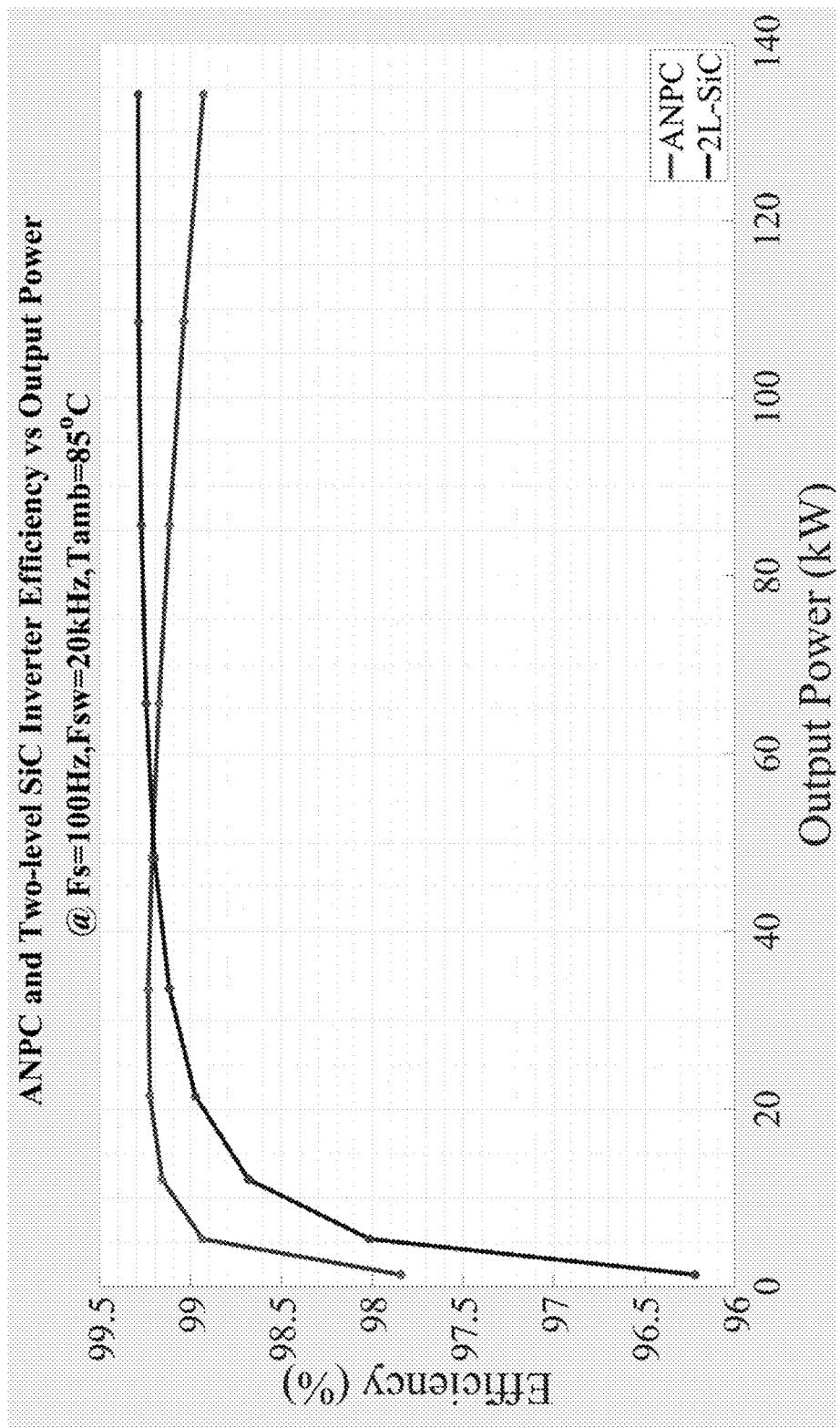
FIG. 11 illustrates an example comparison of all 650V GaN based 3L-ANPC and 1200V SiC MOSFET based 2L inverter efficiency vs output power.

Given that 650V GaN HEMTs are the mainstream choice, a 3L-ANPC topology for EV traction inverters is emerging, particularly for the 800V DC-bus voltage [2]. The efficiency comparison based on same Rds-on of each switch at room temperature of 3L-ANPC inverter and 2L 1200V SIC MOSFET are simulated by PLECS and given in FIG. 11. The 3L-ANPC inverter featuring two GaN System 650V/10 mΩ dies in parallel for each switch, and 2L inverter featuring four Wolfspeed 1200V/21 mΩ SiC MOSFET. The main semiconductor specifications are listed in Table. I and Table. II, and the operating point details are listed in Table. III, respectively [5, 6]. Compared with the traditional 2L SiC inverter, the minimized switching loss of GaN HEMTs combined with more voltage vector selections makes GaN-based 3L-ANPC inverters advantageous in terms of efficiency, particularly in the light and medium load since 95% of an typical EV driving cycle running at less than 30% of full load [2].

However, high voltage slew rate dv/dt and high current slew rate di/dt resulting from fast switching speed makes GaN HEMTs very sensitive to loop parasitic inductance [7]. Therefore, meticulous packaging design to reduce parasitic loop inductance is essential to fully exploit their benefits resulting from fast switching speed. The reported GaN HEMT power modules in literature are mainly focused on packaging 2L half bridge [8]. This paper, to the best knowledge of the authors, for the first time reports the packaging of 3L-ANPC phase leg power module based on 650V/150 A GaN HEMT.

TABLE I

650 V/10 mΩ GAN DIE SPECIFICATIONS

| Parameter | Value | Test conditions |
|---|---|---|
| $R_{DS(on)}$ | 10 mΩ | $V_{GS}$ = 6 V<br>$I_{DS}$ = 50 A<br>$T_j$ = 25° C. |
| $Q_G$ | 33 nC | $V_{GS}$ = 0 to 6 V<br>$V_{DS}$ = 400 V |
| $C_{OSS}$ | 370 pF | $V_{DS}$ = 400 V<br>$V_{GS}$ = 0 V<br>f = 100 kHz |

TABLE II

1200 V/21 mΩ SIC MOSFET E3M0021120K SPECIFICATIONS

| Parameter | Value | Test Conditions |
|---|---|---|
| $R_{DS(on)}$ | 21 mΩ | $V_{GS}$ = 15 V<br>$I_{DS}$ = 62.1 A<br>$T_j$ = 25° C. |
| $Q_G$ | 177 nC | $V_{GS}$ = −4 V to 16 V<br>$V_{DS}$ = 800 V<br>$I_{DS}$ = 62.12 A |

TABLE IV

DBC SPECIFICATIONS

| | Material | Thickness |
|---|---|---|
| Mother DBC | Cu/A1N/Cu | 0.3 mm/1 mm/0.3 mm |
| Daughter DBC | Cu/A1N/Cu | 0.127 mm/0.381 mm/0.127 mm |
| $C_{OSS}$ | 174 pF | $V_{DS}$ = 0 V to 1000 V<br>$V_{GS}$ = 0 V<br>$V_{AC}$ = 25 mV<br>f = 100 kHz |

TABLE III

COMPARISON CONDITIONS

| | |
|---|---|
| DC bus voltage | 800 V |
| Ambient temp. | 85° C. |
| Fundamental frequency | 100 Hz |
| Switching frequency | 20 kHz |
| RL load, power factor 0.85 | |
| SiC junction to coolant thermal resistance $R_{JC, SiC}$ | 0.5° C./W |
| GaN junction-to-coolant thermal resistance $R_{JC, GaN}$ | 0.3° C./W |
| Modulation scheme | 3L-ANPC: (NT-SVPWM, both 0-states are used.<br>2L: 7S-SVPWM |

II. CHALLENGES OF PACKAGING A 3L-ANPC INVERTER PHASE LEG

Figure 12B:
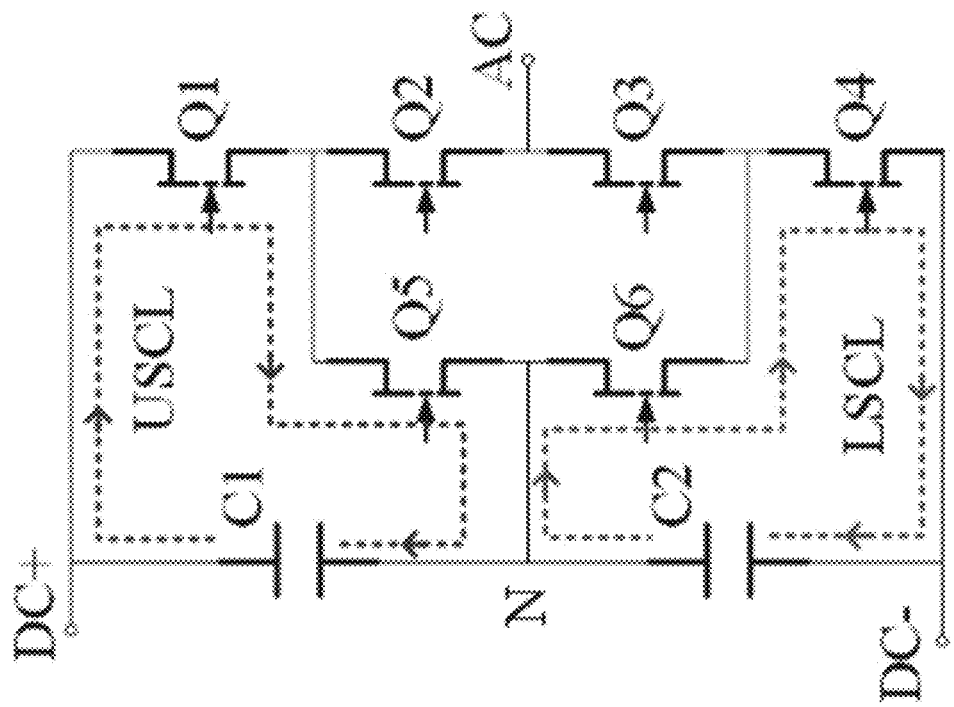
FIG. 12A and FIG. 12B illustrate example commutation loops of a 3L-ANPC phase leg with RL load, including (a) short commutation loops: upper arm short commutation loop (USCL) and lower arm short commutation loop (LSCL) (b) long commutation FIG. 14A, FIG. 14B and FIG. 14C respectively illustrate side view, upper arm layout, and overall power module with bus bar and DC-Link capacitor, of an all GaN based 3L-ANPC phase leg power module.
Figure 12A:
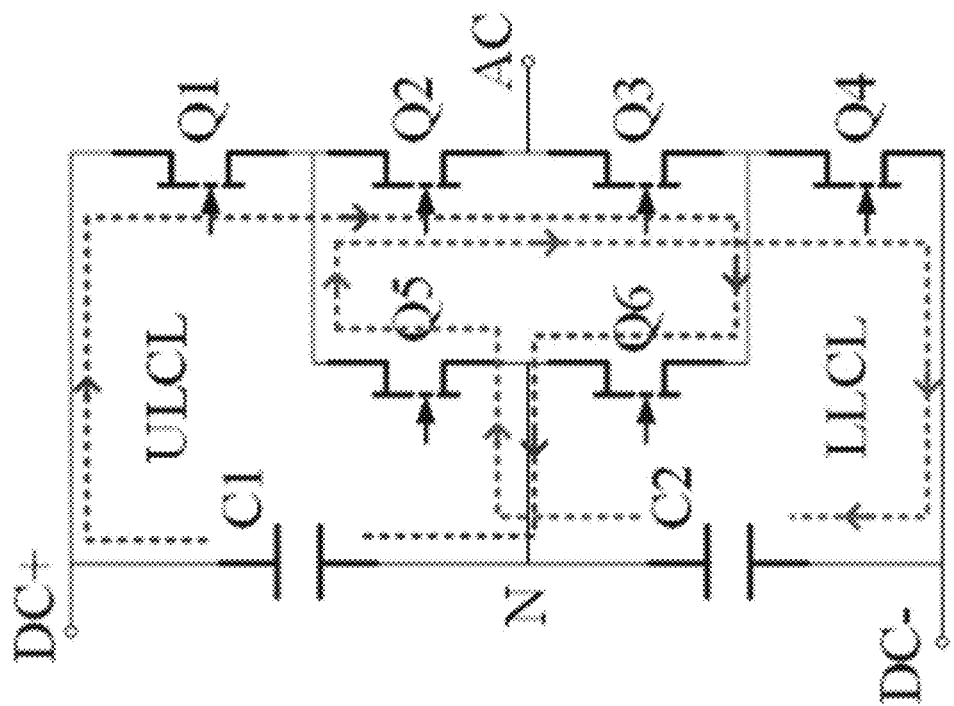

Generally, the loads of EV traction inverter are permanent magnet (PM) motors or induction motors with a lagging power factor around 0.8~0.9, and space vector pulse width modulation (SVPWM) are adopted for the inverter modulation. Thus, the inverter must be capable of 4-quadrant operation, yielding four commutation loops, as shown in FIGS. 12 (a) and (b), two short commutation loops and two long commutation loops [9]. Only two switches involved in the two short commutation loops. However, four switches are involved in the two long commutation loops, which unavoidably increases the loops inductance. Those loop inductances must be reduced simultaneously.

Compared with the 2L half bridge power module, the high number of switches (6 switches vs 2 switches) in the 3L-ANPC phase leg is another main challenge. Three switches interconnected at one node complicate the layout design further. In addition, there are four terminals with an extra neutral terminal and two sets of decoupling capacitors. Furthermore, all the switches must be effectively cooled by attaching to a substrate. Meanwhile, other requirements such as symmetrical layout for parallel dies, minimized gate driving loop inductances, minimized magnetic and electric coupling between power loop and gate driving loop, etc., should also be considered. All of these factors make packaging a 3L-ANPC phase leg power module much more challenging than a 2L half bridge. The design challenges or design objects are summarized as follows:

1) High switch number.
2) Four commutation loops with simultaneously reduced loop inductances.
3) Low junction-to-coolant thermal resistance for all the switches.
4) Symmetrical layout of the parallel dies of each switch.
5) Minimized gate driving loop inductances.
6) Magnetically and electrically decoupled power loops and gate driving loops.
7) Compact design to improve power density.
8) Mechanically robust
9) Ease for mass production

III. POWER MODULE DESIGN AND SIMULATION

A. Structure Design.

Figure 13:
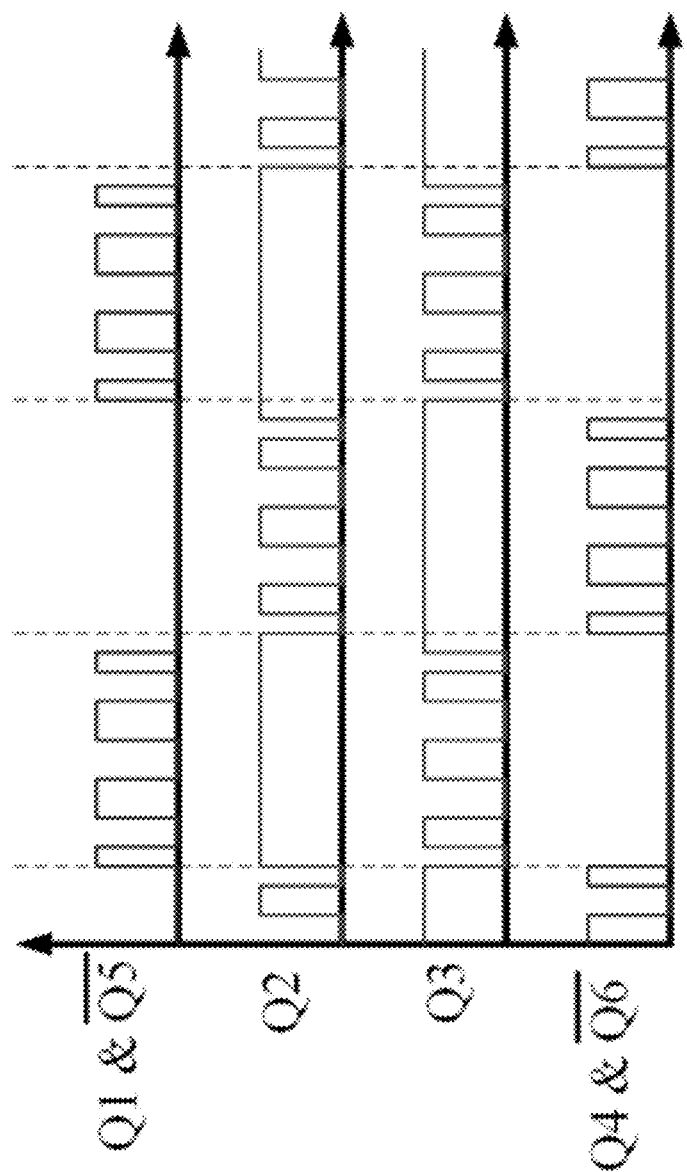
Figure 14A:
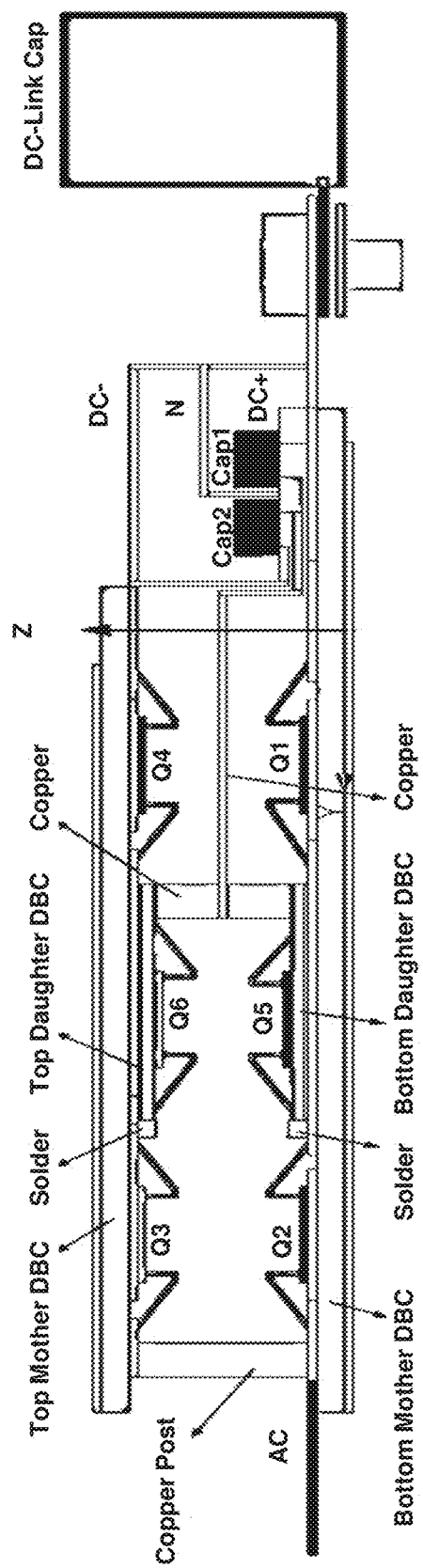
Figure 14B:
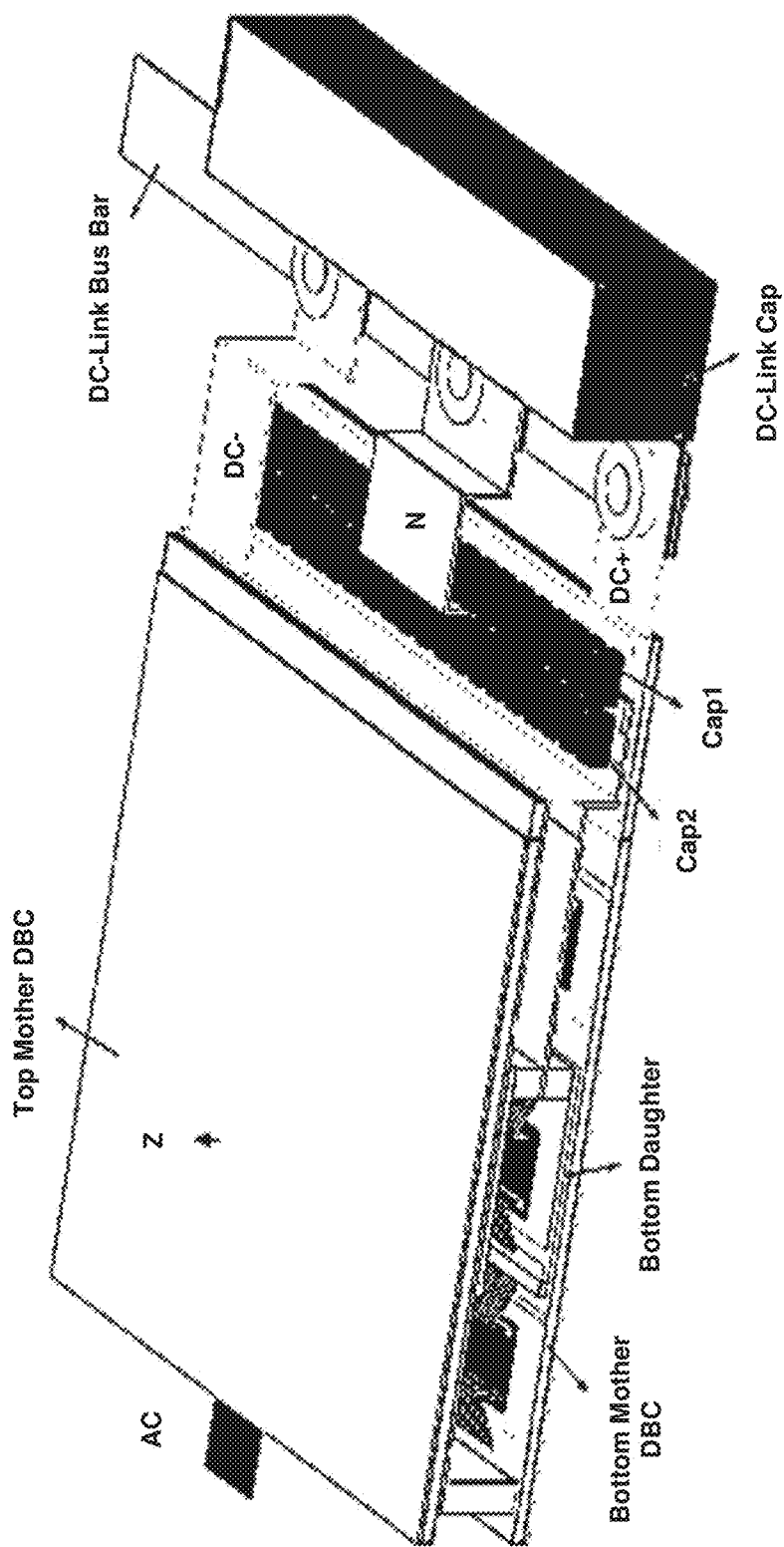
Figure 14C:
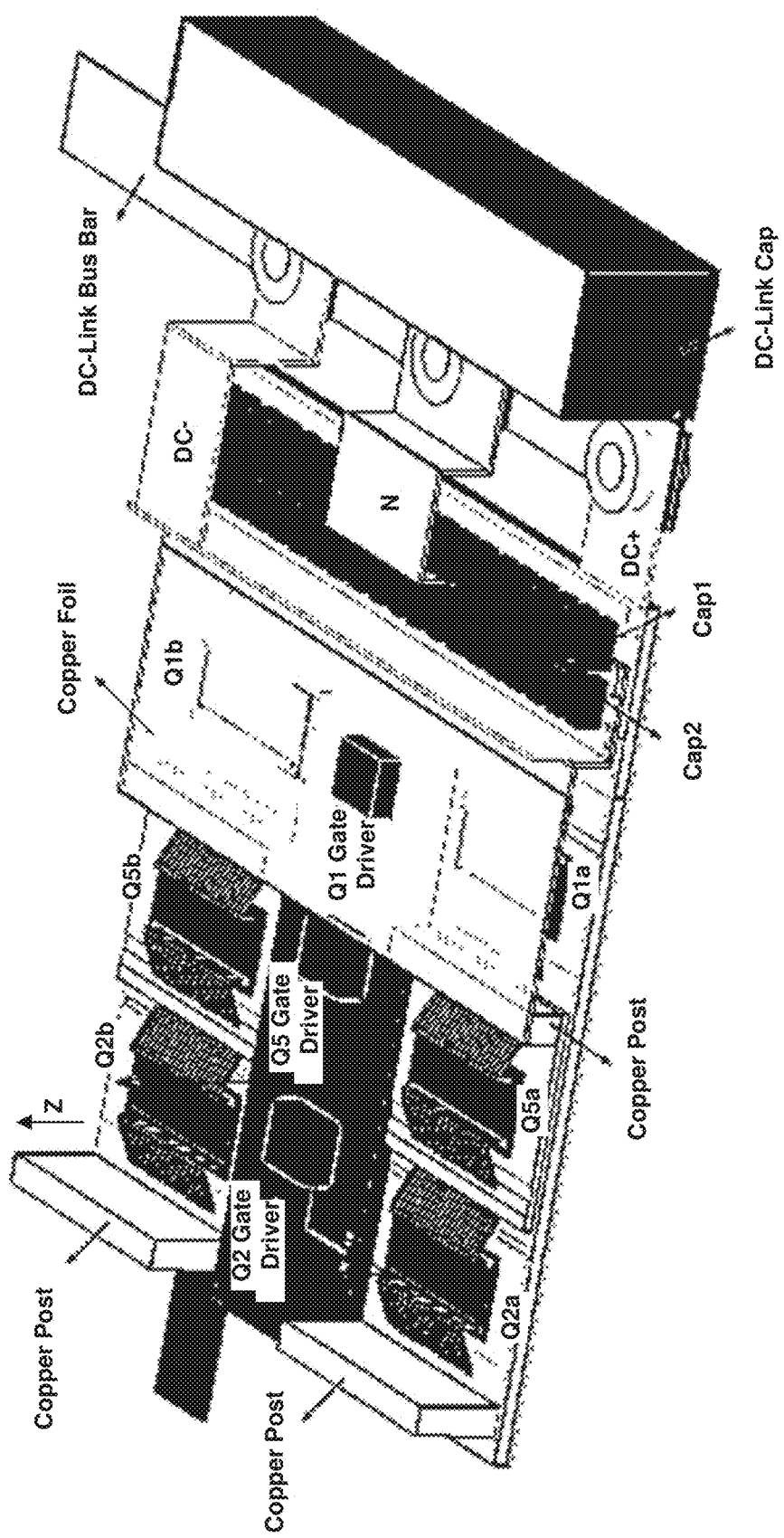

In the proposed design, two mother direct bonded copper substrates (DBCs) and two daughter DBCs are adopted to construct a 3L-ANPC phase leg power module, with each set of DBCs accommodating an arm of a phase leg and the neutral terminal sandwiched in the middle as shown in FIGS. 14 (a), (b) and (c). In order to create another conducting layer to accommodate the interconnection of three dies, the daughter DBCs are attached to the mother DBCs with one edge of the daughter DBC connected to the mother DBC. The switches Q1, Q2, Q3 and Q4 are attached to the two mother DBCs, while the neutral switches Q5 and Q6 are attached to the two daughter DBCs, respectively. The daughter DBCs only serve for die attachment and sitting the wire bonding points. Hence, a thinner DBC can be used. The properties of the mother DBC and daughter DBCs are listed in Table IV, respectively. Given the high current of a traction inverter and relatively small copper thickness of PCBs, PCBs are avoided in the power loop design. FIG. 13 illustrates example gate signals of a 3L-ANPC phase leg (e.g., as shown in FIGS. 14 (a) through (c), etc.).

Figure 15:
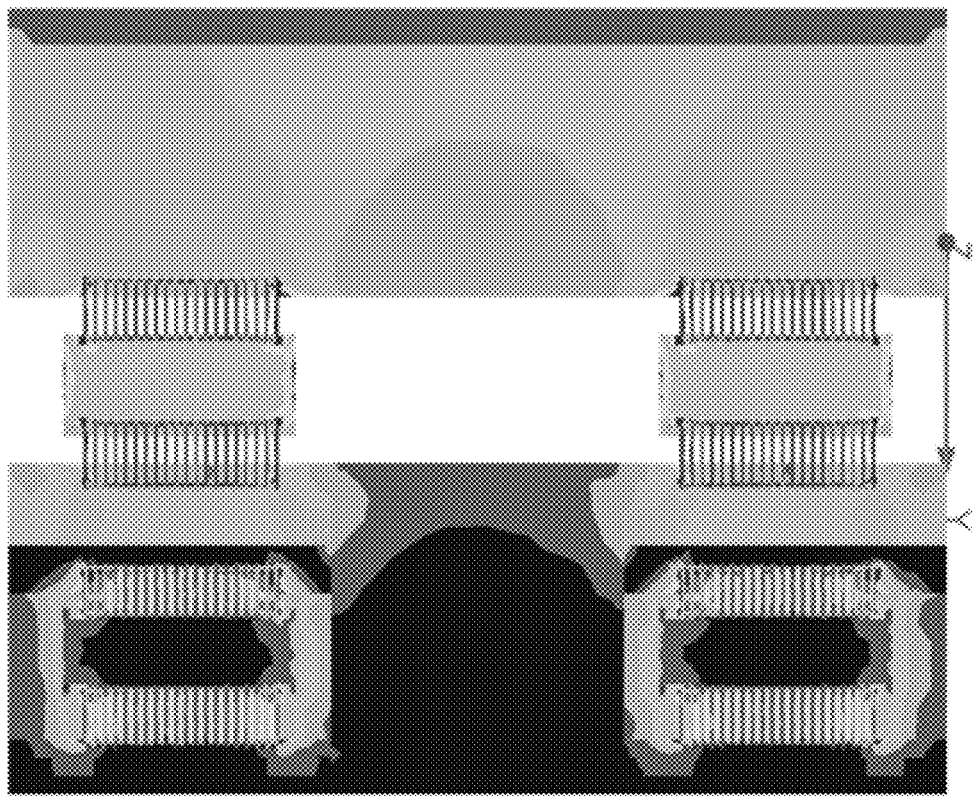
Figure 15:
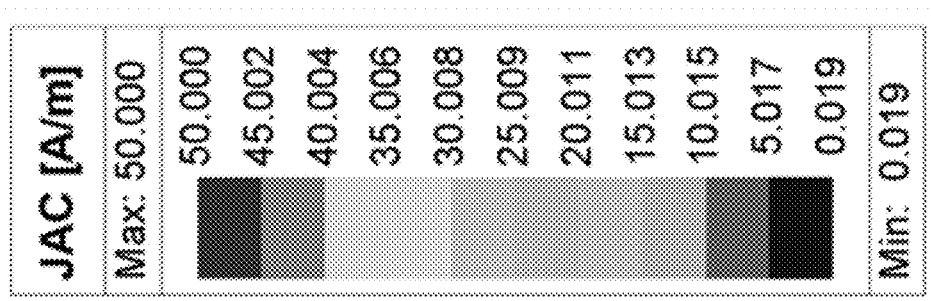

Two long copper posts are used to connect the top mother DBC (lower arm) and bottom mother DBC (upper arm), and four short copper posts are used to connect the two neutral switches to the neutral terminal. They also provide the mechanical support and withstand the mechanical stresses from the top and bottom cold plates. Distributed terminals with a thin layer of Kapton coating are adopted. Two sets of decoupling capacitors are placed on those wide terminals. Besides connecting the power module and DC-Link capacitor, they also serve to (a) accommodate the decoupling capacitors, (b) evenly distribute the current among the two parallel dies in steady state (fundamental frequency) and during fast transient commutation period as shown in FIG. 15, (c) cool the decoupling capacitors, and (d) provide mechanical support on the DC-Link side.

B. Loop Inductance.

Figure 16A:
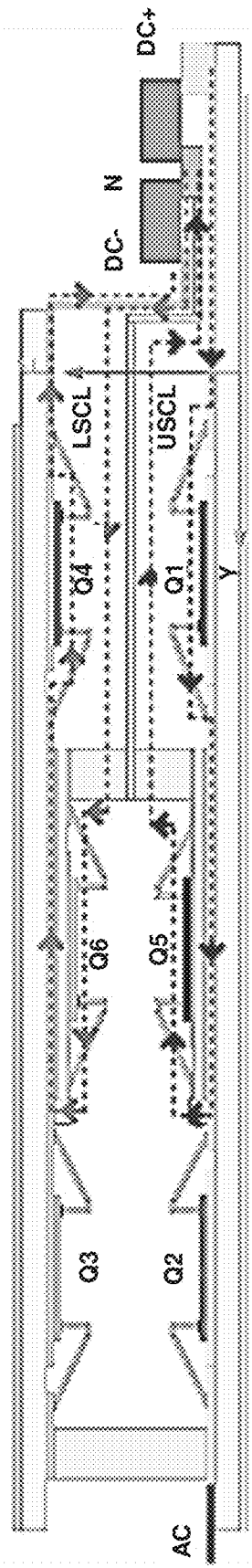
FIG. 16A illustrates example short commutation loops.
Figure 16B:
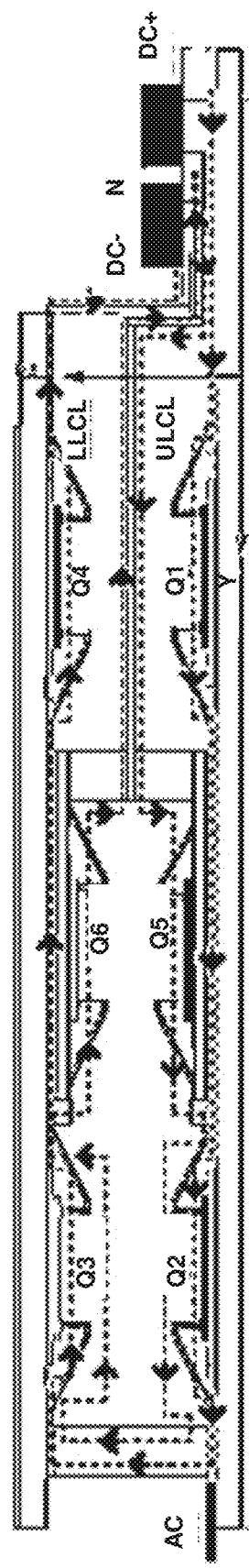
FIG. 16B illustrates long commutation loops.

The two short commutation loops and two long commutation loops are marked in FIGS. 16 (a) and (b), respectively. Flux cancelling is one of effective methods to reduce the loop inductance [10]. By maximizing the negative mutual inductance, the total loop inductance is minimized. In the proposed design, the forward current paths and the backward current paths of both the short and long commutation loops are fully overlapped, so that the magnetic flux can be canceled to the maximum extent. By ANSYS Q 3D simulation, the loop inductances are still very low: 1.92 nH and 5.21 nH at 100 MHz for the short commutation loops and long commutation loops, respectively. If wire-bonding connection are replaced by copper foil connection, the distance between the two mother DBCs and the distance between the neutral terminal and mother DBCs can be further shortened. Consequently, the loop inductances can be further reduced. Double pulse test (DPT) simulation is then carried out by LTSpice. The maximum Vds is 540V for the long commutation loops and 471V for the short commutation loops at a 400V DC bus voltage and 200 A switch current, representing 135% and 118% of the DC bus voltage, respectively. This maximum voltage is in the safe operating region of the 650V devices.

C. Thermal Performance.

Figure 18:
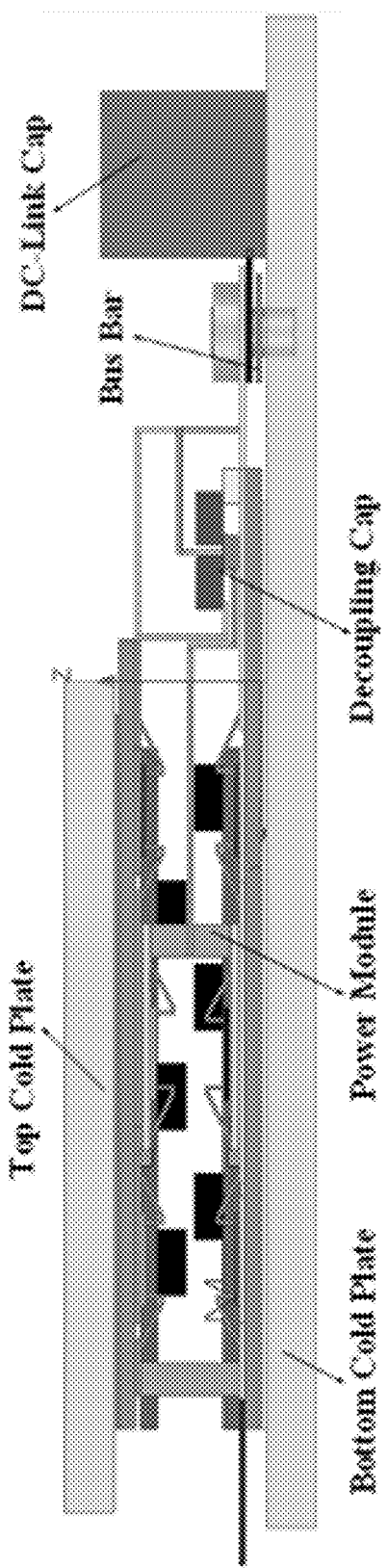
Figure 19B:
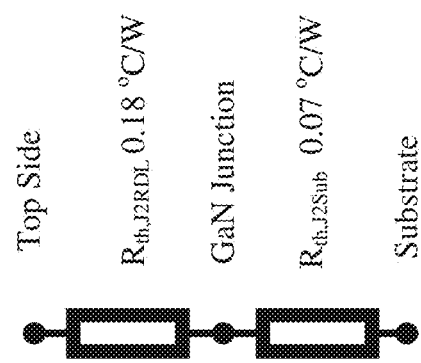
FIG. 19A illustrates an example GaN System 650V E-mode GaN die GS-065-150-1-D; 19B illustrates an example thermal network model.
Figure 19A:
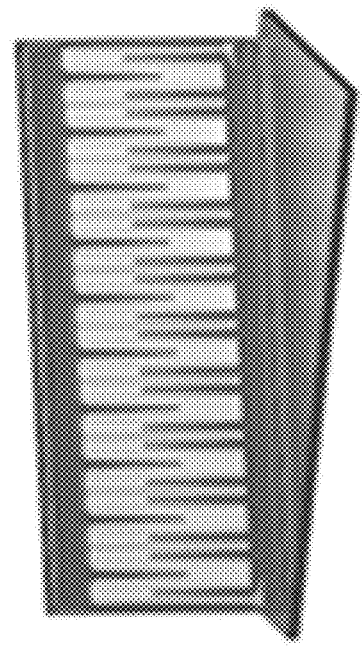
Figure 20A:
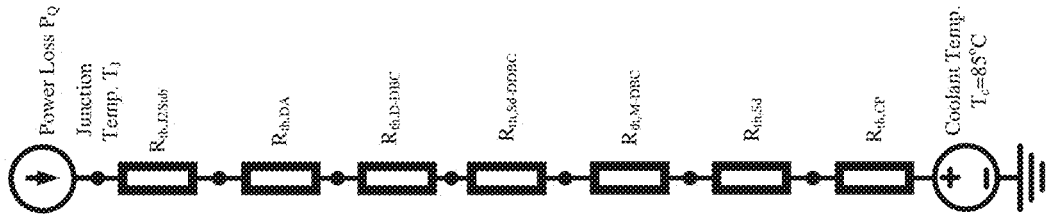
FIG. 20A illustrates an example thermal network model of Q1, Q2, Q3 and Q4.
Figure 20B:
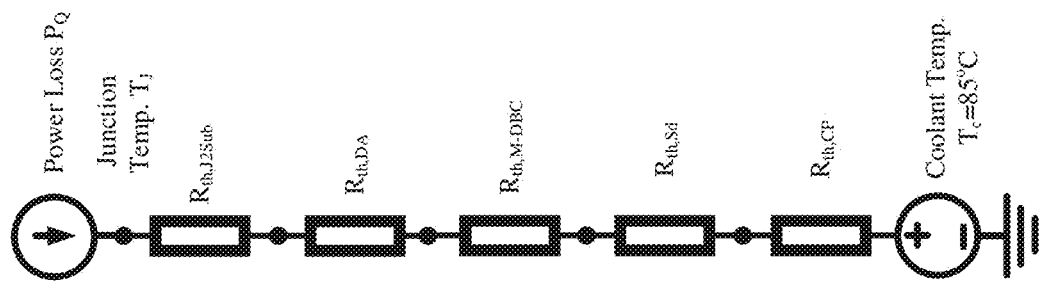
FIG. 20B illustrates and example thermal network model of Q5 and Q6.
Figure 21:
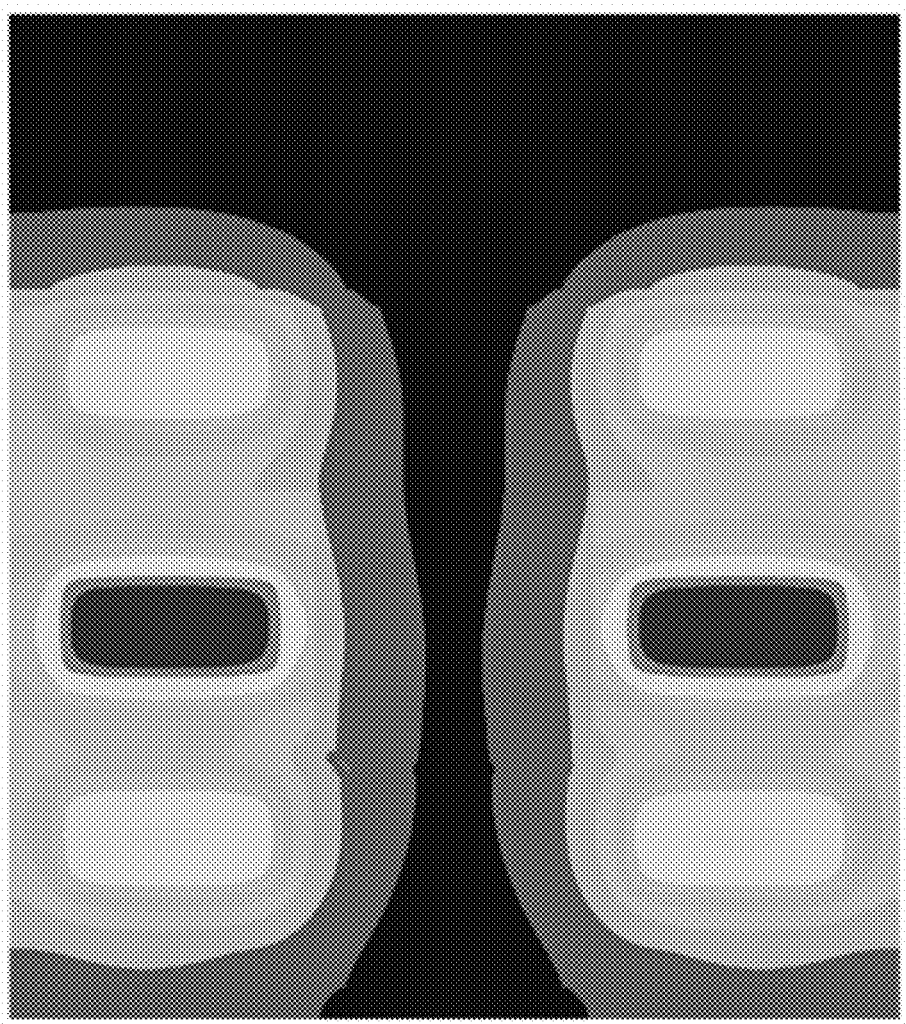
FIG. 21 illustrates an example simulated power module temperature map of lower mother DBC.

The power module is sandwiched between two cold plates and double-sided cooled as illustrated in FIG. 18. The thermal network model of the used GaN die is given in FIGS. 19 (a) and (b), in which the junction-to-substrate thermal resistance and junction-to-top side thermal resistance are 0.07° C./W and 0.18° C./W. Due to the small contact area between the bond wires and the die, little heat are conducted to the DBC by the bond wires. The heat is mainly dissipated through the substrate side. The junction-to-coolant thermal network model of Q1~Q4 and Q5~Q6 are given in FIGS. 20 (a) and (b), respectively. $R_{th,J2Sub}$, $R_{th,DA}$, $R_{th,M-DBC}$, $R_{th,D-DBC}$, $R_{th,Sd}$, $R_{th,CP}$ are thermal resistance of GaN die junction-to-substrate, die attachment layer, mother DBC, daughter DBC, solder layer and cold plate, respectively. The die attachment layer, even very thin, can contribute significant portion of the total thermal resistance [11]. The temperature map simulated by ANSYS Icepak with 35 W per die, copper cold plate thickness 5 mm and constant coolant temperature at 85° C. is shown in FIG. 21. The maximum junction temperatures of Q1~Q4 and Q5~Q6 are 97.9° C. and 103.5° C., respectively. The simulated junction to coolant thermal resistance for Q1~Q4 and Q5, Q6 are 0.37° C./W and 0.53° C./W respectively, including an inserted 0.13° C./W die attachment layer thermal resistance [12]. The daughter DCBs introduce some extra thermal resistance, which lead to the higher junction temperature Q5 and Q6 than that of Q1~Q4. Another benefit of the power module structure is that, even though the decoupling capacitor and DC-Link capacitor are not included in the thermal model, those capacitors can also be effectively cooled, too.

IV. CONCLUSIONS

In this paper, a 3L-ANPC phase leg power module based on GaN System E-mode 650V/10 mΩ bare dies with double-sided cooling, low loop inductances and low thermal resistances and mechanical robustness is proposed for EV taction inverter applications. First, the challenges of packaging a 3L-ANPC phase leg power module are pointed out, followed by a detailed description of the proposed power module structure. Those challenges are well addressed by the proposed structure. The simulated loop inductances of the long loops and short loops are 5.21 nH and 1.92 nH, respectively; and the simulated the turn-off voltage spike are 540V and 471V, respectively. They are within safe operating range the 650V devices. The simulated junction-to-coolant thermal resistance are different at 0.37° C./W and 0.53° C./W for Q1~Q4 and Q5, Q6 switches, respectively. This uneven thermal resistance will be addressed in the future work. Prototyping and experimental testing will be conducted in the future work.

REFERENCES [1] through as identified below are incorporated by reference in their entirety.

[1] B. Bilgin et al., "Making the Case for Electrified Transportation," IEEE Transactions on Transportation Electrification, vol. 1, no. 1, pp. 4-17, 2015

[2] J. Lu, R. Hou, P. D. Maso, and J. Styles, "A GaN/Si Hybrid T-Type Three-Level Configuration for Electric Vehicle Traction Inverter," in 2018 IEEE 6th Workshop on Wide Bandgap Power Devices and Applications (WiPDA), 31 Oct.-2 Nov. 2018 2018, pp. 77-81.

[3] "US Drive Electrical and Electronics Technical Team Roadmap." https://www.energy.gov/eere/vehicles/articles/us-drive-electrical-and-electronics-technical-team-roadmap (accessed.

[4] N. Keshmiri, D. Wang, B. Agrawal, R. Hou, and A. Emadi, "Current Status and Future Trends of GaN HEMTs in Electrified Transportation," IEEE Access, vol. 8, pp. 70553-70571, 2020

[5] G. Systems. "650V Enhancement Mode GaN Transistor GS-065-150-1-D2." https://gansystems.com/gan-transistors/gs-065-150-1-d2/

[6] Wolfspeed, "E-Series Automotive-Qualified Silicon Carbide MOSFETs: 1200 V, 21 mΩ, 104 A, TO-247-4 package, Gen 3 Discrete SiC MOSFET."

[7] S. Lu, T. Zhao, Z. Zhang, K. D. T. Ngo, R. Burgos, and G. Q. Lu, "Low Parasitic-Inductance Packaging of a 650 V/150 A Half-Bridge Module Using Enhancement-Mode Gallium-Nitride High Electron Mobility Transistors," IEEE Transactions on Industrial Electronics, vol. 70, no. 1, pp. 344-351, 2023

[8] A. I. Emon, H. Mustafeez ul, A. B. Mirza, J. Kaplun, S. S. Vala, and F. Luo, "A Review of High-Speed GaN Power Modules: State of the Art, Challenges, and Solutions," IEEE Journal of Emerging and Selected Topics in Power Electronics, vol. 11, no. 3, pp. 2707-2729, 2023

[9] Y. Jiao and F. C. Lee, "New Modulation Scheme for Three-Level Active Neutral-Point-Clamped Converter With Loss and Stress Reduction," IEEE Transactions on Industrial Electronics, vol. 62, no. 9, pp. 5468-5479, 2015

[10] H. Ke, U. Mehrotra, and D. C. Hopkins, "3-D Prismatic Packaging Methodologies for Wide Band Gap Power Electronics Modules," IEEE Transactions on Power Electronics, vol. 36, no. 11, pp. 13057-13066, 2021

[11] T.-H. Cheng, K. Nishiguchi, Y. Fukawa, B. J. Baliga, S. Bhattacharya, and D. C. Hopkins, "Thermal and Reliability Characterization of an Epoxy Resin-Based Double-Side Cooled Power Module," Journal of Microelectronics and Electronic Packaging, vol. 18, no. 3, pp. 123-136, 2021

[12] J. Dai, J. Li, P. Agyakwa, M. Corfield, and C. M. Johnson, "Comparative Thermal and Structural Characterization of Sintered Nano-Silver and High-Lead Solder Die Attachments During Power Cycling," IEEE Transactions on Device and Materials Reliability, vol. 18, no. 2, pp. 256-265, 2018

What is claimed is:

1. A power module comprising:
an upper arm structure that includes a first semiconductor switch, a second semiconductor switch and a first diode;
a lower arm structure that includes a third semiconductor switch, a fourth semiconductor switch and a second diode;
a first gate driving board, attached with the upper arm, wherein the first gate driving board includes a first gate driver connected to a first gate of the first semiconductor switch and a second gate driver connected to a second gate of the second semiconductor switch;
a second gate driving board, attached with the lower arm, wherein the second gate driving board includes a third gate driver connected to a third gate of the third semiconductor switch and a fourth gate driver connected to a fourth gate of the fourth semiconductor switch.

2. The power module of claim 1, wherein the power module is configured to be operable in first operational states in which first electric currents of equal magnitudes flow in two short commutation loops.

3. The power module of claim 1, wherein the power module is configured to be operable in second operational states in which second electric currents of equal magnitudes flow in two long commutation loops.

4. The power module of claim 1, wherein the upper arm structure includes a first mother substrate to which the first diode is directly attached; wherein the lower arm structure includes a second mother substrate to which the second diode is directly attached.

5. The power module of claim 1, wherein the first semiconductor switch, the second semiconductor switch and the first diode on the upper arm structure form a spatial symmetry with the third semiconductor switch, the fourth semiconductor switch and the second diode on the lower arm structure.

6. The power module of claim 1, further comprising:
a direct current (DC) positive terminal (DC+);
a DC negative terminal (DC−).

7. The power module of claim 6, wherein spatial planes of the lower and upper arm structures are parallel to each other; wherein the DC+ and DC− are vertically arranged relative to the spatial planes of the lower and upper arm structures.

8. The power module of claim 6, wherein spatial planes of the lower and upper arm structures are parallel to each other; wherein the DC+ and DC− are horizontally arranged relative to the spatial planes of the lower and upper arm structures.

9. The power module of claim 1, wherein the first, second, third and fourth semiconductor switches include a first vertical Gallium Nitrate (GaN) switch disposed on the upper arm structure and a second vertical GaN switch disposed on the lower arm structure; wherein the first and second vertical GaN switches form a spatial symmetry to each other.

10. The power module of claim 1, wherein the first, second, third and fourth semiconductor switches include a first lateral Gallium Nitrate (GaN) switch disposed on the upper arm structure and a second lateral GaN switch disposed on the lower arm structure; wherein the first and second lateral GaN switches form a spatial symmetry to each other.

11. The power module of claim 1, wherein each of the first, second, third and fourth semiconductor switches includes two semiconductor switch dies.

12. The power module of claim 11, wherein the first and second gate driving boards include a gate driving board that is centrally located in between the two semiconductor switch dies; wherein the gate driving board includes a first gate driving circuit connected to a first die of the two semiconductor switch dies and a second gate driving circuit connected to a second die of the two semiconductor switch dies.

13. The power module of claim 11, wherein the first and second gate driving boards include a gate driving board that is centrally located on a same side of the two semiconductor switch dies; wherein the gate driving board includes a first gate driving circuit connected to a first die of the two semiconductor switch dies and a second gate driving circuit connected to a second die of the two semiconductor switch dies.

14. The power module of claim 11, wherein the first and second gate driving boards include a gate driving board having a first gate driving board portion located at a first side of the two semiconductor switch dies and a second gate driving board portion located at a second different side of the two semiconductor switch dies; wherein the first gate driving board portion includes a first gate driving circuit connected to a first die of the two semiconductor switch dies; wherein the second gate driving board portion includes a second gate driving circuit connected to a second die of the two semiconductor switch dies.

15. The power module of claim 1, further comprising: an alternating current (AC) terminal.

16. The power module of claim 15, wherein the AC terminal is located on a first side plane formed between the upper and lower arm structures; wherein a direct current (DC) positive terminal (DC+), a DC negative terminal (DC−), and a neutral terminal (N) of the power module are located on a second opposing plane formed between the upper and lower art structures.

17. The power module of claim 16, wherein the DC+ and the N are electrically connected with a first group of decoupling capacitors; the DC− and the N are electrically connected with a second group of decoupling capacitors.

18. The power module of claim 1, further comprising: two or more posts mechanically attached to the upper and lower arm structures.

19. The power module of claim 1, wherein the upper arm structure is attached to a first cooling plate on a first side of the power module; wherein the lower arm structure is attached to a second different cooling plate on a second opposing side of the power module.

20. The power module of claim 1, wherein one or more of the first, second, third and fourth semiconductor switches and the first and second diodes are attached to one or more of two mother substrates of the upper and lower arm structures by way of one or more daughter substrates.

* * * * *